(12) United States Patent  (10) Patent No.: US 9,195,138 B2
Sasagawa et al.  (45) Date of Patent: Nov. 24, 2015

(54) LIQUID PROCESSING APPARATUS, LIQUID PROCESSING METHOD AND STORAGE MEDIUM

(75) Inventors: Norihiko Sasagawa, Koshi (JP); Hiroichi Inada, Koshi (JP); Yasushi Takiguchi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 793 days.

(21) Appl. No.: 13/222,049

(22) Filed: Aug. 31, 2011

(65) Prior Publication Data

US 2012/0052190 A1 Mar. 1, 2012

(30) Foreign Application Priority Data

Sep. 1, 2010 (JP) ................................ 2010-195840

(51) Int. Cl.
*G03F 7/18* (2006.01)
*G03F 7/16* (2006.01)
*H01L 21/30* (2006.01)
*H01L 21/67* (2006.01)
*G03F 7/30* (2006.01)

(52) U.S. Cl.
CPC ............ *G03F 7/162* (2013.01); *H01L 21/6715* (2013.01); *G03F 7/3021* (2013.01); *H01L 21/67178* (2013.01)

(58) Field of Classification Search
CPC .. G03F 7/162; G03F 7/3021; H01L 21/67178
See application file for complete search history.

(56) References Cited

U.S. PATENT DOCUMENTS

| 5,416,047 A | * | 5/1995 | Konishi et al. ............. 430/271.1 |
| 2002/0043214 A1 | * | 4/2002 | Inada et al. .................. 118/668 |
| 2006/0134340 A1 | * | 6/2006 | Ishikawa et al. ........... 427/421.1 |

FOREIGN PATENT DOCUMENTS

| JP | 2010-034210 A | | 2/2010 |
| JP | 2010-045185 A | | 2/2010 |
| JP | 2010034210 A | * | 2/2010 |

* cited by examiner

*Primary Examiner* — Dah-Wei D Yuan
*Assistant Examiner* — Stephen Kitt
(74) *Attorney, Agent, or Firm* — Pearne & Gordon LLP

(57) ABSTRACT

There is provided a liquid processing apparatus including a first and a second processing regions provided in a left-right direction, each for accommodating a substrate and performing a process on the substrate by a processing solution from a nozzle; a rotary body rotatable about a vertical axis; a plurality of nozzles provided at the rotary body while kept in a standby state at an outside of the processing regions, commonly used for the processing regions; a nozzle transfer device, having a nozzle holder moving back and forth, provided at the rotary body and configured to transfer a nozzle into a selected one of the processing regions while holding the selected nozzle by the nozzle holder; and a rotation driving unit configured to rotate the rotary body so as to allow a front of the nozzle holder in a forward/backward direction thereof to face the selected one of the processing regions.

13 Claims, 25 Drawing Sheets

FIG. 13
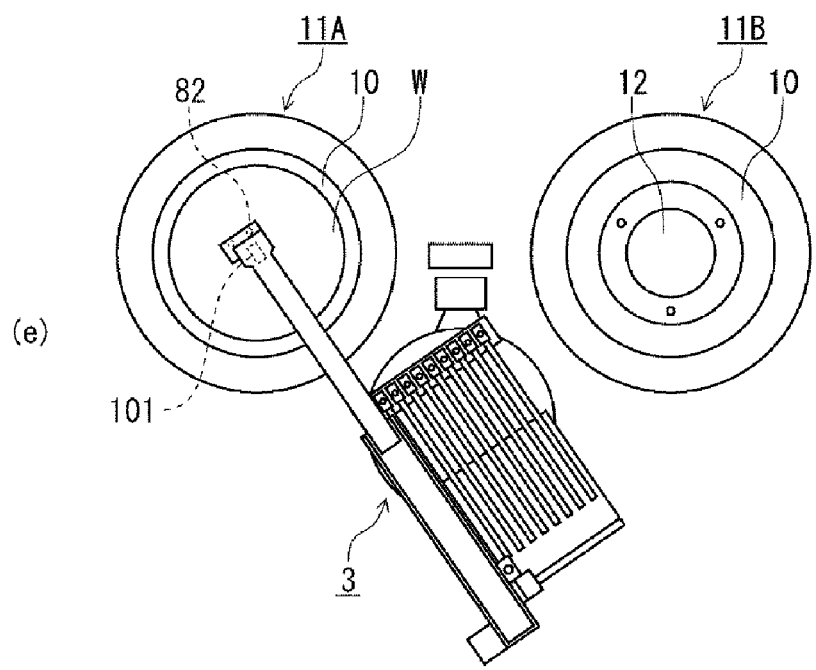
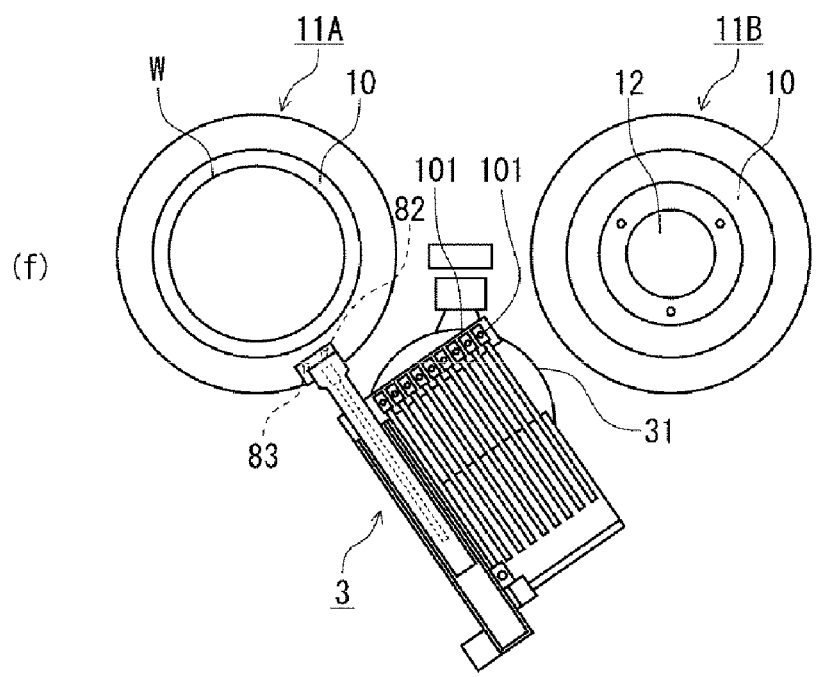

FIG. 14
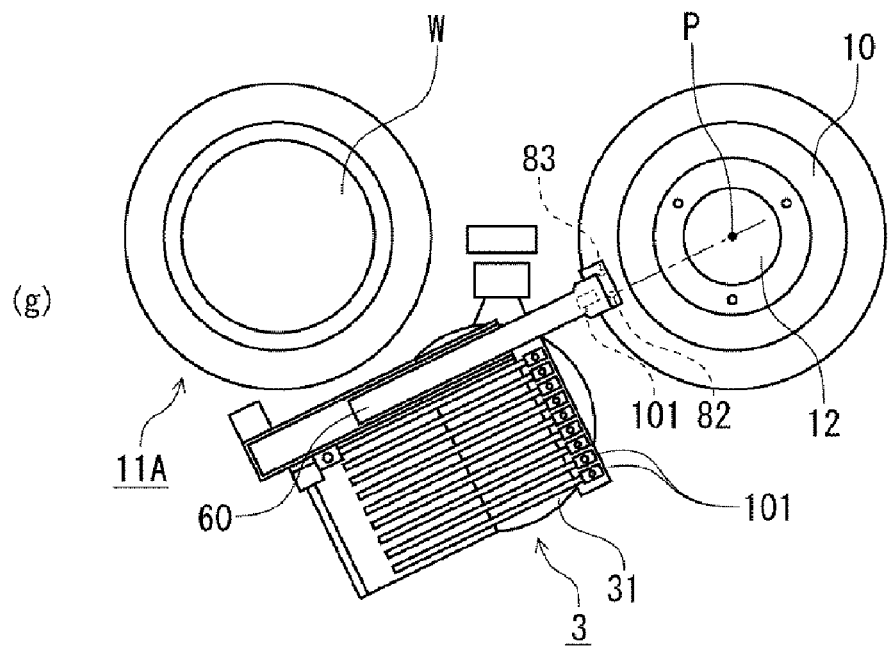
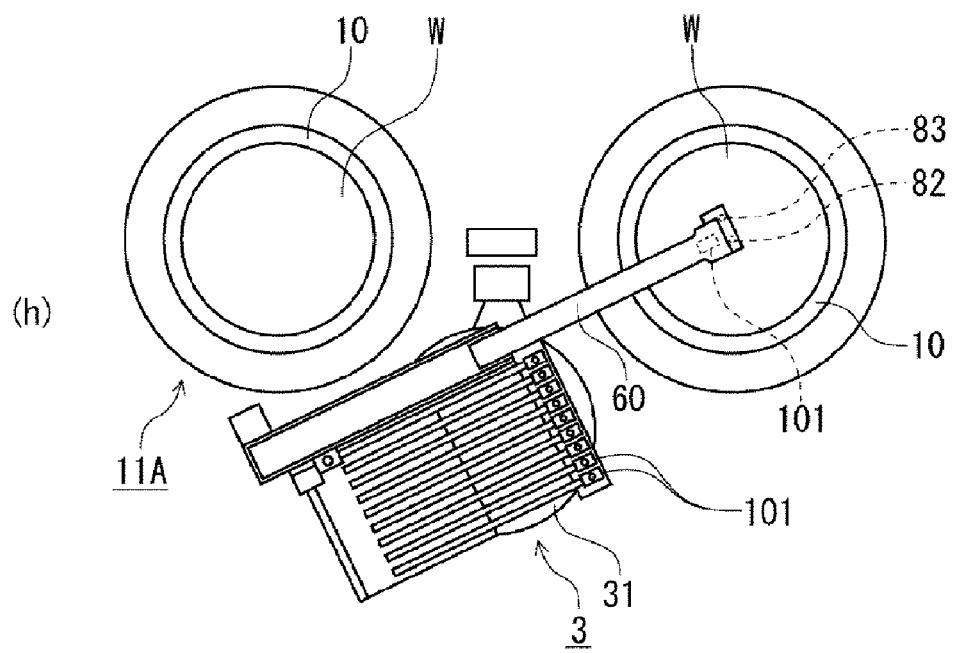

LIQUID PROCESSING APPARATUS, LIQUID PROCESSING METHOD AND STORAGE MEDIUM

CROSS-REFERENCE TO RELATED APPLICATION

This application claims the benefit of Japanese Patent Application No. 2010-195840 filed on Sep. 1, 2010, the entire disclosures of which are incorporated herein by reference.

FIELD OF THE INVENTION

The present disclosure relates to a liquid processing apparatus and a liquid processing method for performing a liquid process on a substrate by supplying a processing solution to the substrate, and also relates to a storage medium.

BACKGROUND OF THE INVENTION

In a photolithography process for manufacturing a semiconductor device, various processing solutions such as resist are supplied to a surface of a semiconductor wafer (hereinafter, simply referred to as "wafer") which is used as a substrate. A coating and developing apparatus for performing the photolithography process includes a liquid processing apparatus for supplying the various processing solutions.

As an example liquid processing apparatus, there is known a resist coating apparatus. The resist coating apparatus includes a coating processing unit for coating, for example, resist. By way of example, the coating processing unit includes a holding unit for holding the wafer or a cup surrounding a periphery of the wafer held by the holding unit so as to prevent dispersion of the resist.

In order to improve throughput, a multiple number of coating processing units are provided in the resist coating apparatus, and the respective coating processing units are capable of processing wafers at the same time. Further, in order to reduce cost and space, the multiple number of coating processing units may share a common nozzle for supplying the resist. In such a case, the nozzle supported at an arm may move above horizontally arranged cups in an arrangement direction of the cups, and may supply the resist onto the wafers in the respective cups. By way of example, such a resist coating processing unit is described in Patent Document 1.

Recently, as semiconductor devices are diversified, various kinds of resists are used. For the reason, a multiple number of nozzles for supplying the different kinds of resists may be arranged at the arm, and the respective nozzles may be moved together. With this configuration, however, in order to carry out maintenance of a single nozzle, all nozzles need to be moved into a standby section outside the coating processing unit and processing of all wafers need to be stopped. Thus, there has been a demand for improving throughput by making it possible to carry out maintenance of one nozzle while processing wafers by other nozzles.

Described in Patent Document 2 is a liquid processing apparatus including a guide extending in an arrangement direction of a multiple number of cups; a nozzle standby section having a base member moved in a lengthwise direction of the guide and a multiple number of nozzles; and an arm moving forwardly and backwardly in a direction orthogonal to a moving direction of the base member. In this liquid processing apparatus, the base member and the nozzle standby section are guided and moved to the front of each cup. Then, after the nozzles are lifted and moved to above the cup by a leading end portion of the arm, a liquid process is performed. In order to move the nozzle standby section and the base member to the front of the cups, however, the guide needs to be located in front of the multiple number of cups. Thus, an installation space of the apparatus becomes increased.

Furthermore, in Patent Document 1, three cups are arranged in a straight line. When a wafer is processed, a processing nozzle is moved from above a cup to above another cup via above an intermediate cup. When the processing nozzle is moved above the intermediate cup, however, there is a possibility that a processing solution may drop from the processing nozzle onto the wafer. As a result, a defect may occur and a production yield may be reduced.

Patent Document 1: Japanese Patent Laid-open Publication No. 2010-045185
Patent Document 2: Japanese Patent Laid-open Publication No. 2010-34210 (FIGS. 1 and 8)

BRIEF SUMMARY OF THE INVENTION

In view of the foregoing, the present disclosure provides a technique capable of improving throughput by carrying out maintenance of a processing nozzle that is not currently used during a substrate process in a liquid processing apparatus. This technique also enables saving space.

In accordance with one aspect of the present disclosure, there is provided a liquid processing apparatus including: a first processing region and a second processing region arranged in a left-right direction, each for accommodating therein a substrate horizontally and performing therein a process on the substrate by a processing solution from a nozzle; a rotary body positioned at a rear side of an arrangement of the first and the second processing regions, and configured to be rotatable about a vertical axis; a plurality of processing nozzles provided at the rotary body while kept in a standby state at an outside of the first processing region and the second processing region, commonly used for the first processing region and the second processing region, and configured to supply different kinds of processing solutions to the substrate, respectively; a nozzle transfer device, having a nozzle holder capable of being moved back and forth, provided at the rotary body and configured to transfer a processing nozzle selected from the plurality of processing nozzles into a selected one of the first and the second processing regions while holding the selected processing nozzle by the nozzle holder; and a rotation driving unit configured to rotate the rotary body so as to allow a front of the nozzle holder in a forward/backward direction thereof to face the selected one of the first and the second processing regions.

In accordance with another aspect of the present disclosure, there is provided a liquid processing method including: accommodating a substrate horizontally in each of a first processing region and a second processing region, arranged in a left-right direction, for performing therein a process on the substrate by a processing solution from a nozzle; rotating a rotary body, positioned at a rear side of an arrangement of the first and the second processing regions, about a vertical axis; keeping a plurality of processing nozzles provided at the rotary body in a standby state at an outside of the first processing region and the second processing region; supplying different kinds of processing solutions to the substrate from the plurality of processing nozzles; holding a processing nozzle selected from the plurality of processing nozzles by a nozzle holder provided at the rotary body and configured to be capable of moving back and forth; transferring the nozzle holder into selected one of the first and the second processing regions by a nozzle transfer device; and rotating the rotary body by a rotation driving unit so as to allow a front of the nozzle holder in a forward/backward direction thereof to face the selected one of the first and the second processing regions.

In accordance with still another aspect of the present disclosure, there is provided a computer-readable storage medium having stored thereon computer-executable instructions that, in response to execution, cause a liquid processing apparatus to perform the above-mentioned liquid processing method.

In accordance with the present disclosure, a plurality of processing nozzles may be provided at the rotary body while kept in a standby state at an outside of the first processing region and the second processing region and may be commonly used for the first processing region and the second processing region. Further, a nozzle holder may be moved back and forth to each of the processing regions and provided at the rotary body. Moreover, a selected processing nozzle may be transferred to each of the processing regions. Thus, it is possible to carry out maintenance of a processing nozzle that is not currently used during a substrate process. Therefore, it is possible to suppress a throughput reduction. Further, since it is not necessary to provide a guide member, extended over the respective processing regions, for guiding the nozzle holder, an installation space of the apparatus can be decreased. Furthermore, the apparatus of the present disclosure may have two coating processing units. In addition, a multiple number of such apparatuses may be arranged depending on a desired throughput level. Accordingly, since a nozzle transfer device need not be moved across the coating processing units, it is possible to prevent that a processing solution from a processing nozzle drops onto the substrate, thereby suppressing a production yield reduction.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIGS. 13(e) and 13(f) are diagrams for illustrating an operation of the resist coating apparatus;

FIGS. 14(g) and 14(h) are diagrams for illustrating an operation of the resist coating apparatus;

DETAILED DESCRIPTION OF THE INVENTION

Figure 1:
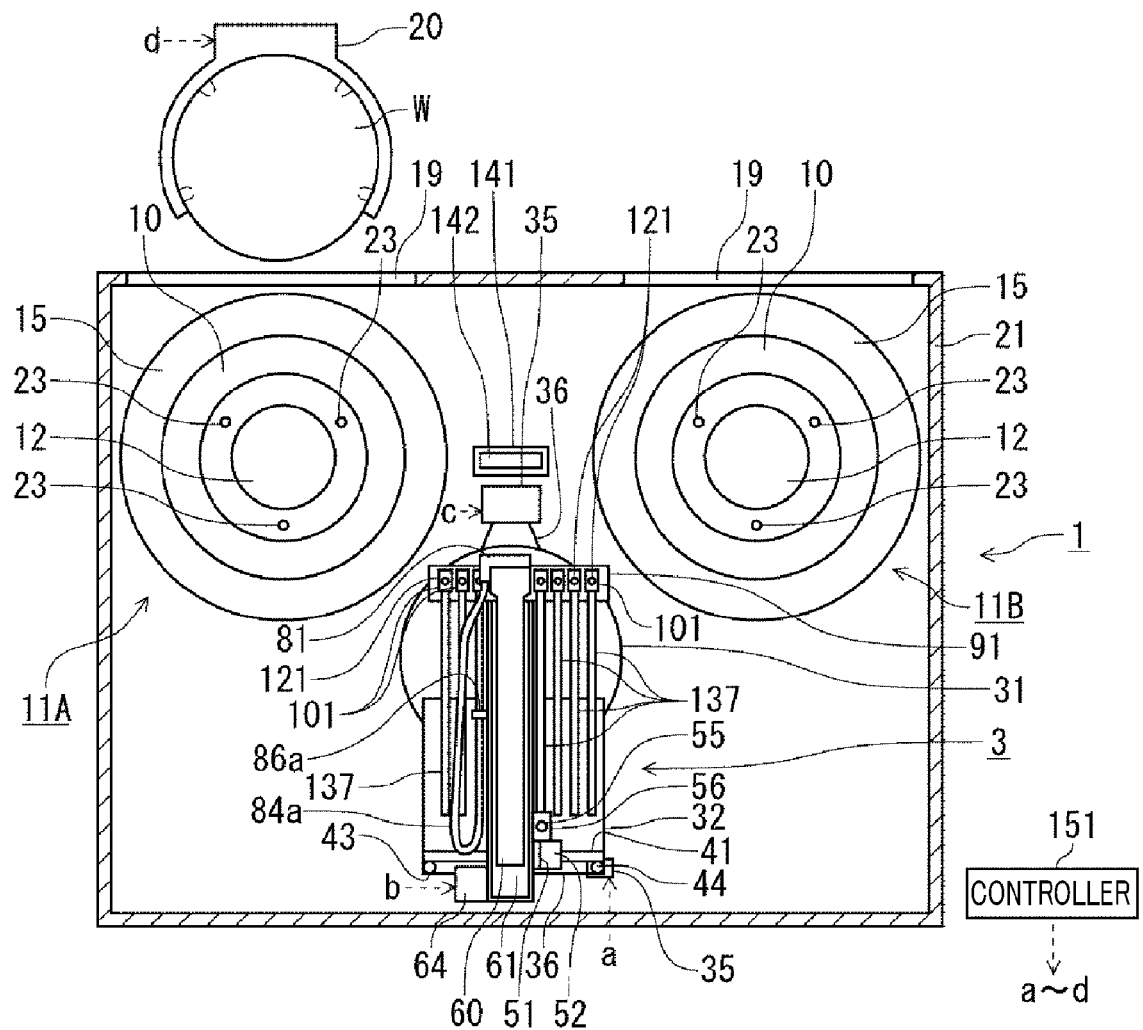
FIG. 1 is a plane view of a resist coating apparatus in accordance with an embodiment of the present disclosure.
Figure 2:
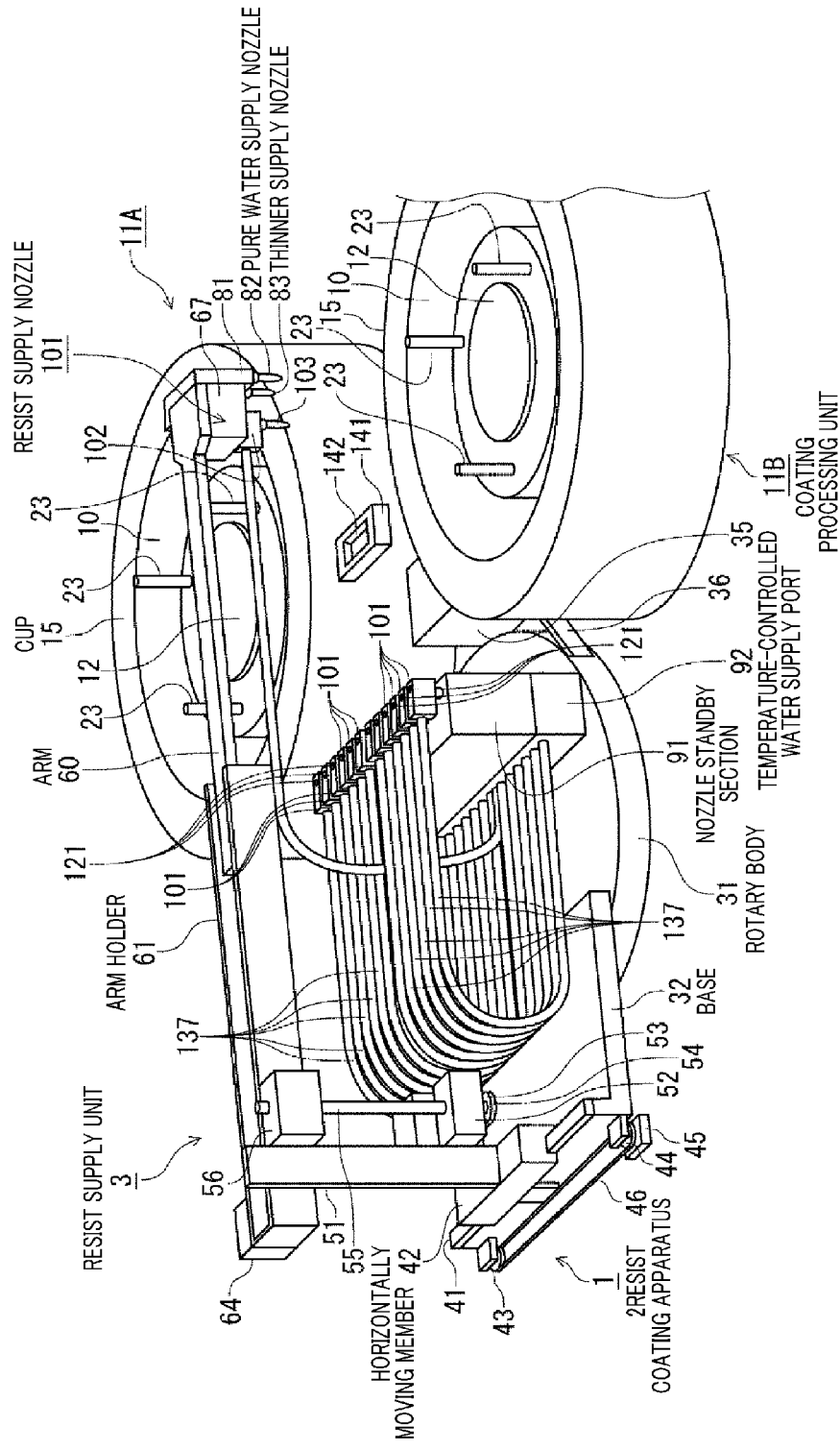
FIG. 2 is a perspective view of the resist coating apparatus.

A resist coating apparatus 1 as an example liquid processing apparatus in accordance with the present disclosure will be explained with reference to FIGS. 1 and 2. FIG. 1 is a plane view of the resist coating apparatus 1 and FIG. 2 is a perspective view thereof. The resist coating apparatus 1 may include two coating processing units 11 and a resist supply unit 3. A wafer W as a substrate is transferred into the coating processing unit 11 from a pre-processing apparatus. Further, the resist coating apparatus may also include a housing 21 that surrounds the two coating processing units 11 and the resist supply unit 3. Two transfer ports 19 are formed in a sidewall of the housing 21. A substrate transfer device 20 enters into the housing 21 through the transfer ports 19 and transfers/receives the wafer W to/from the coating processing unit 11.

Figure 3:
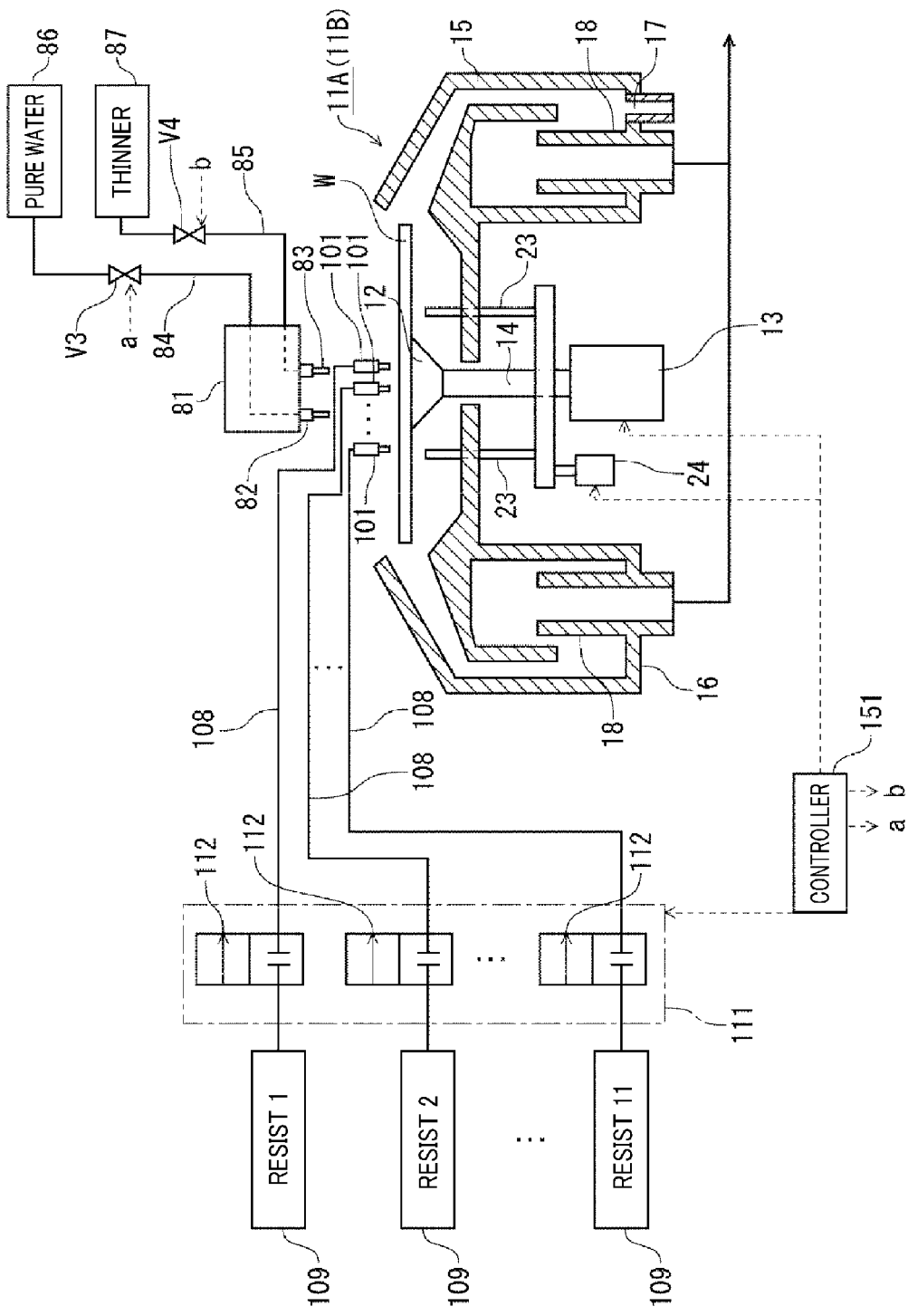
FIG. 3 is a longitudinal cross sectional view of a coating processing unit of the resist coating apparatus.

The coating processing units 11A and 11B are arranged in a horizontal direction and have the same configuration. For the simplicity of explanation, the coating processing unit on a left side, when viewed from the resist supply unit 3, will be assigned a reference numeral 11A while the coating processing unit on a right side will be assigned a reference numeral 11B. Below, description will be provided with reference to FIG. 3 illustrating a longitudinal cross sectional view of the coating processing unit 11A. The coating processing unit 11 may include a spin chuck 12 and a rotation driving unit 13. The spin chuck 12 serves as a substrate holding unit for attracting and horizontally holding a central portion of a rear surface of the wafer W. The rotation driving unit 13 is connected to the spin chuck 12 via a rotation shaft 14. The spin chuck 12 is rotated about a vertical axis by the rotation driving unit 13 while the wafer W is held on the spin chuck 12.

A cup 15 is disposed around the spin chuck 12 so as to surround a periphery of the wafer W on the spin chuck 12. The inside of the cup 15 serves as a processing region for the wafer W. An opening 10 is formed in a top portion of the cup 15, and a liquid sump 16 having, e.g., a recess shape is provided in a bottom portion of the cup 15. A liquid drain port 17 is disposed at the liquid sump 16, and an uprightly standing gas exhaust port 18 for exhausting a processing atmosphere within the cup 15 is also provided at the liquid sump 18.

In the drawings, a reference numeral 23 denotes an elevation pin that can be moved up and down, and three elevation pins 23 (only two are shown in FIG. 3 for the convenience) are provided within the cup 15. As the substrate transfer unit 20 for transferring the wafer W into the resist coating apparatus 1 is operated, an elevating unit 24 moves the elevation pins 23 upwardly. Then, the wafer W is transferred from the substrate transfer device 20 onto the spin chuck 12.

Figure 4:
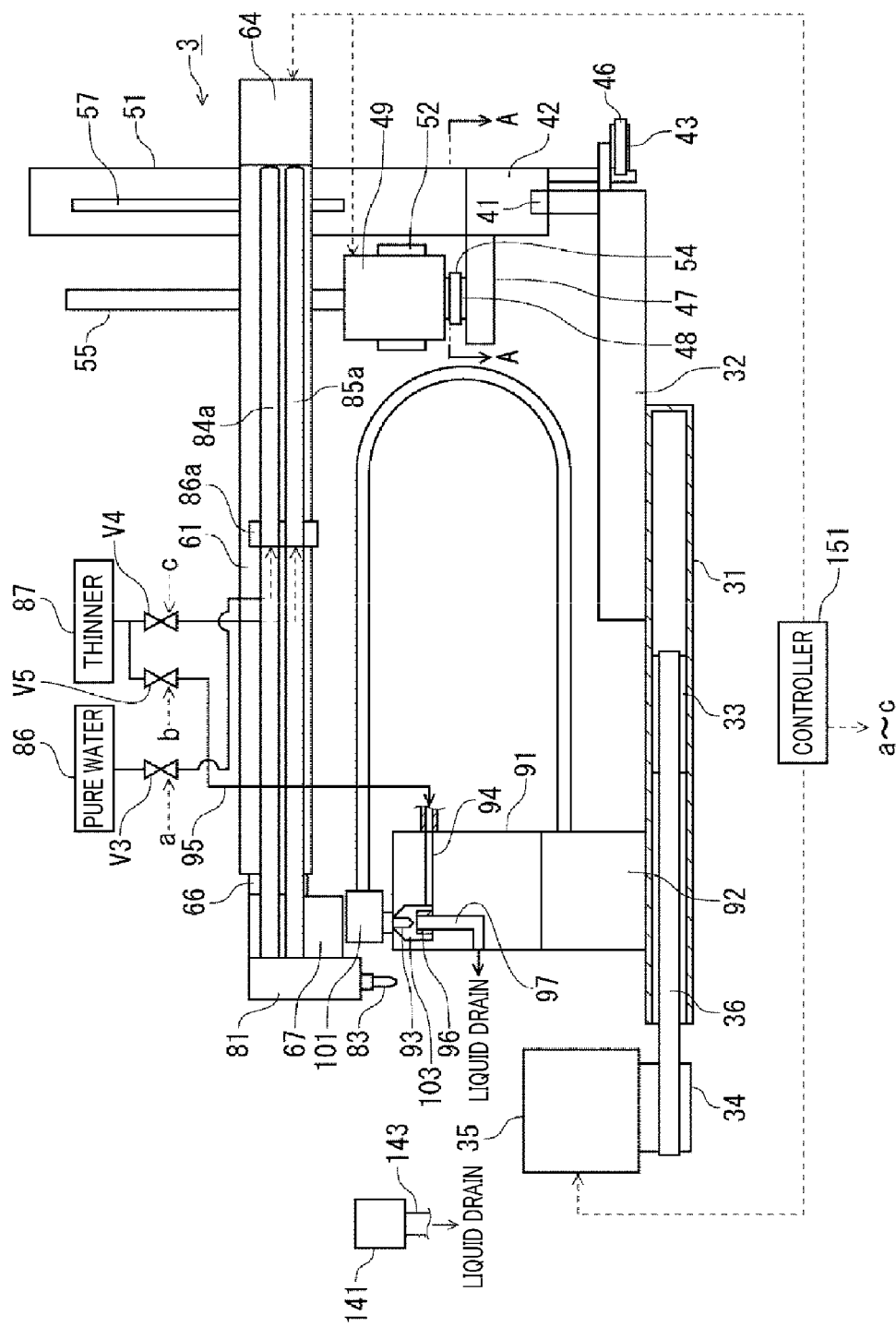
FIG. 4 is a side view of a resist supply unit of the resist coating apparatus.
Figure 5:
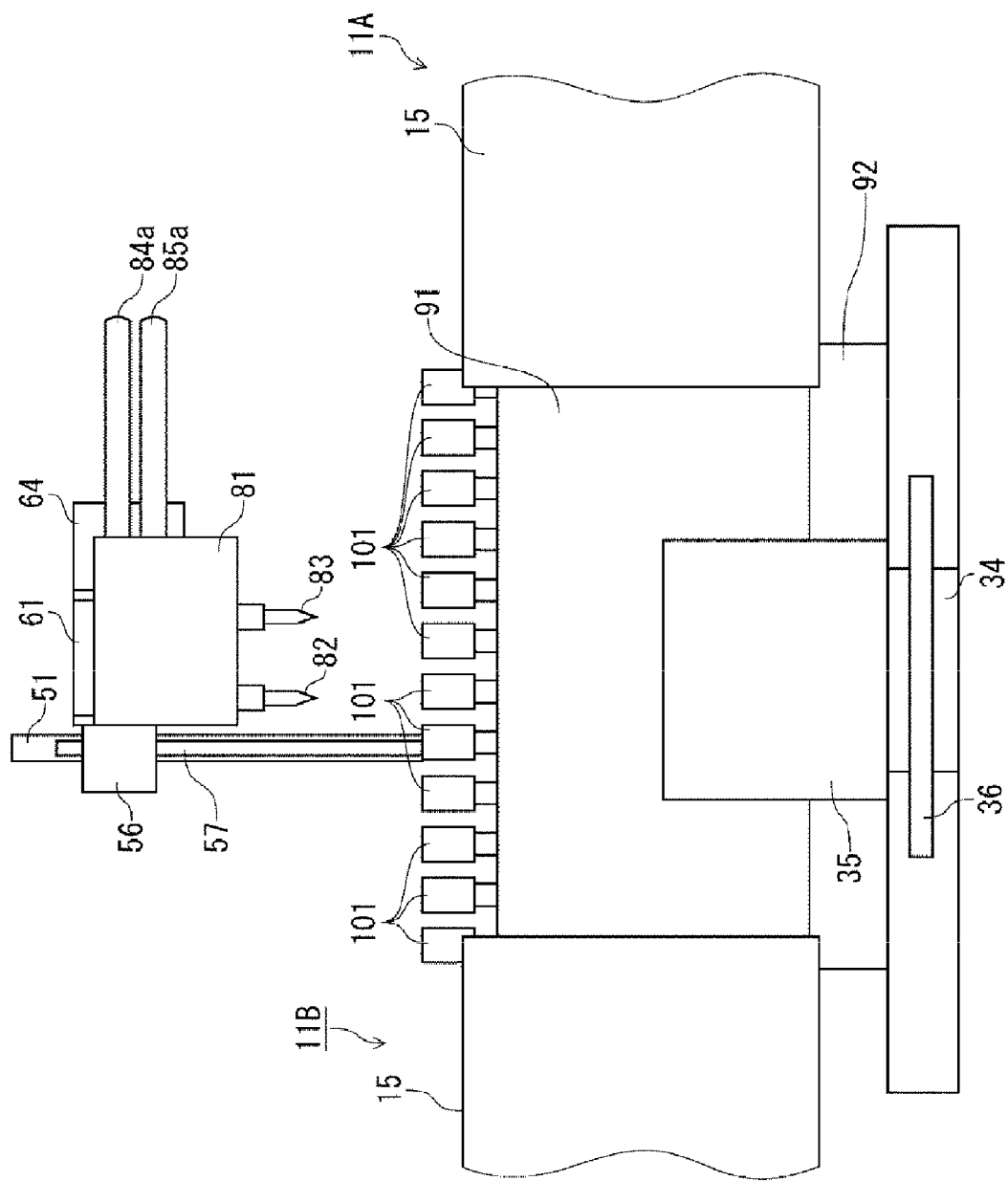
FIG. 5 is a front view of the resist supply unit.

Now, the resist supply unit 3 will be explained with reference of FIGS. 4 and 5. FIG. 4 is a side view of the resist supplying unit 3 and FIG. 5 is a front view thereof. The resist supply unit 3 is located at a position toward an inside of the housing 21 between the coating processing units 11A and 11B. The resist supply unit 3 includes a rotary body 31 having a flat circular shape, and a rectangular plate-shaped base 32 is provided on the rotary body 31. Provided within the rotary body 31 is an idler pulley 33, and the idler pulley 33 is fastened to the rotary body 31. A driving pulley 34 is provided near the rotary body 31, and an output shaft of a motor 35 serving as a rotation driving unit is connected to the driving pulley 34. A belt 36 is wound around the driving pulley 34 and the idler pulley 33. As the motor 35 is driven to rotate the driving pulley 34, the belt 36 is rotated, so that the idler pulley 33 is rotated. As the idler pulley 33 is rotated, the rotary body 31 is rotated about a vertical axis along with the base 32. A distance between a rotation center of the rotary body 31 and a rotation center of the spin chuck of the coating processing unit 11A is the same as a distance between the rotation center of the rotary body 31 and a rotation center of a spin chuck 12 of the coating processing unit 11B.

When a side of the base 32 facing the coating processing unit 11 is defined as a front side, a guide member 41 extending in a horizontal direction is provided at a rear side of the base 32, and a horizontally moving member 42 is provided at the guide member 41. A driving pulley 44 and an idler pulley 43 are provided at a rear end of the base 32 in an extending direction of the guide member 41. The driving pulley 44 is connected with an output shaft of a motor 45. A belt 46 is wound around the driving pulley 44 and the idler pulley 43, and the horizontally moving member 42 is connected with the belt 46. As the motor 45 is driven to rotate the driving pulley 44, the belt 46 is also rotated. As the belt 46 is moved, the horizontally moving member 42 is guided by the guide member 41 and moved horizontally.

Figure 6:
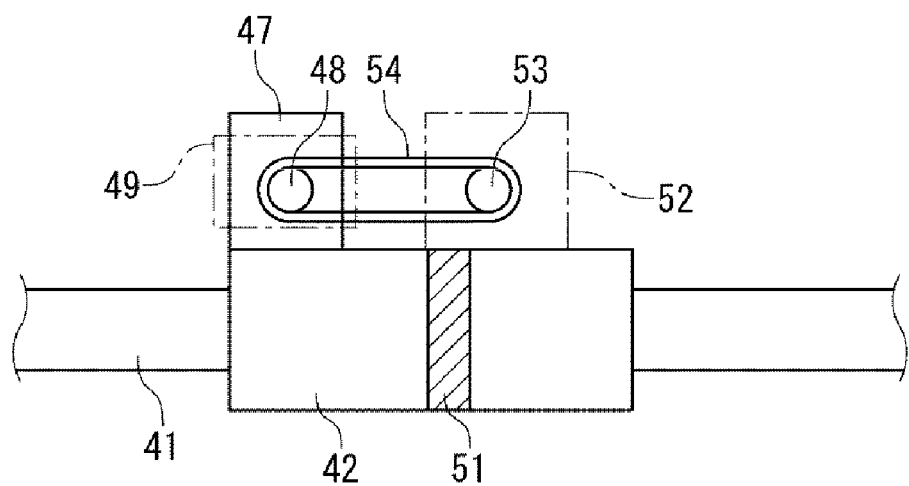
FIG. 6 is a cross sectional view taken along an arrow A-A of FIG. 4.

FIG. 6 is a cross sectional view taken along an arrow A-A of FIG. 4. As illustrated in FIGS. 4 and 6, a supporting table 47 is protruded from the horizontally moving member 42 toward the front side, and a driving pulley and a motor 49 for driving the driving pulley 48 are provided on the supporting table 47. Further, an upwardly extending supporting column 51 is provided at the horizontally moving member 42, and a supporting member 52 is fastened to the supporting column 51. An idler pulley 53 is provided at the supporting member 52, and a belt 54 is wound around the driving pulley 48 and the idler pulley 53. The idler pulley 53 is connected to a vertically extending ball screw 55, and the ball screw 55 is screwed to a supporting member 56 located on the supporting member 52.

The supporting member 56 is connected with an arm holder 61 to be described later, and the arm holder 61 is connected with a guide 57 vertically extended and provided at the supporting column 51, as shown in FIG. 4. If the driving pulley 48 is driven to rotate by the motor 49, the ball screw 55 as well as the idler pulley 53 is also rotated about an axis thereof. As a result, the arm holder 61 is moved up and down along the guide 57.

Figure 7:
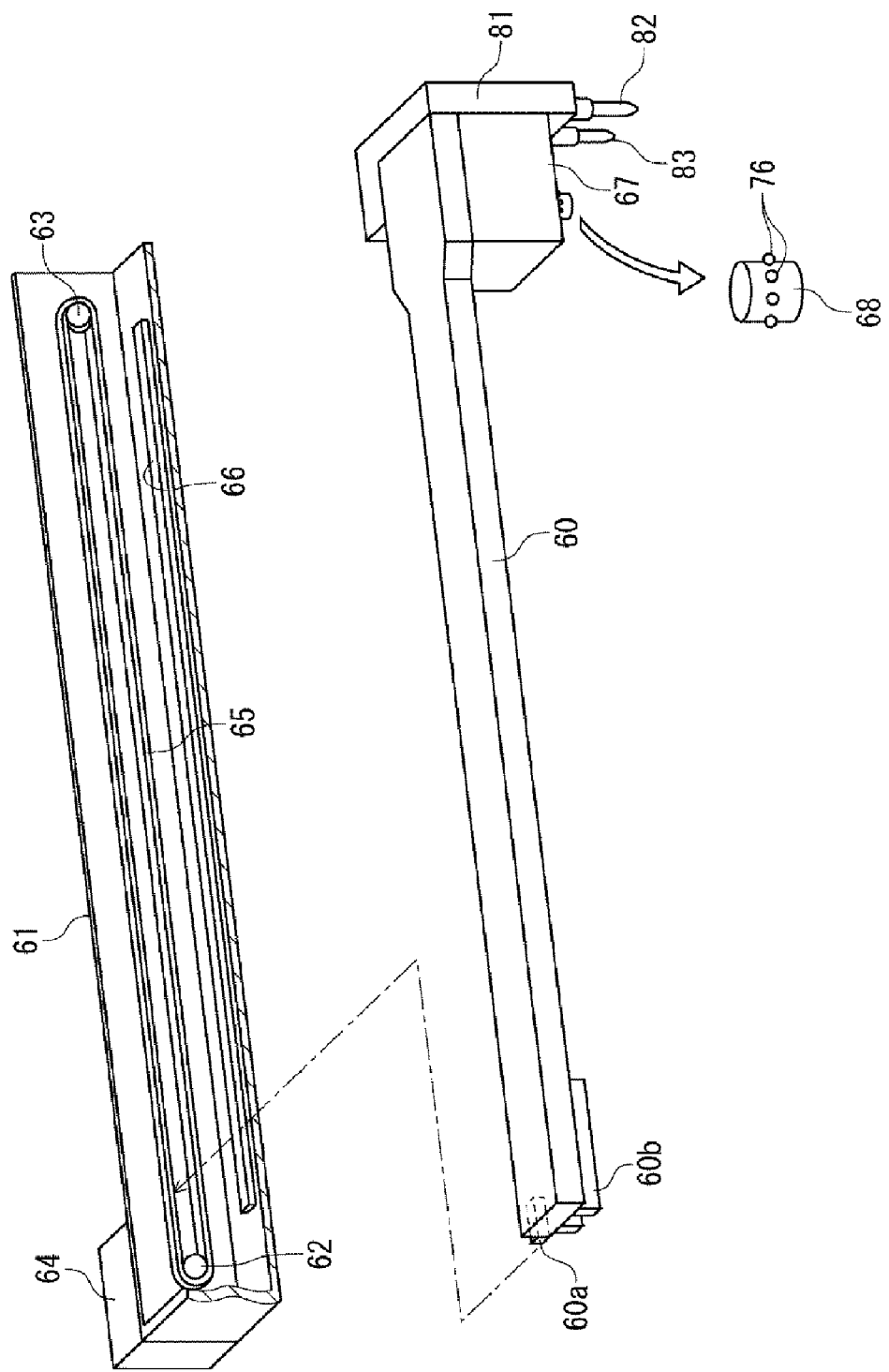
FIG. 7 is a perspective view illustrating an arm and an arm holder of the resist supply unit.

Now, the arm holder 61 will be described. The arm holder 61 is formed in a rectangular case shape having an open top and an open front. Further, the arm holder 61 is elongated in a forward/backward direction. FIG. 7 is a longitudinal cross sectional view of the arm holder 61. As depicted in FIG. 7, an idler pulley 63 and a driving pulley 62 are provided at a front portion and a rear portion on an inner side surface of the arm holder 61, respectively. The driving pulley 62 is connected with an output shaft of a motor 64 provided at an outer side of the arm holder 61. A belt 65 is wound around the driving pulley 62 and the idler pulley 63, and a guide member 66 is provided at a bottom of the arm holder 61.

An arm 60 elongated in the forward/backward direction and serving as a nozzle transfer device is provided within the arm holder 61. A connection member 60a connected with the belt 65 is located at an outer side of the arm 60. A reference numeral 60b in the drawings denotes an engaging member engaged with the guide member 66. As the driving pulley 62 is driven to rotate by the motor 64, the belt 65 is rotated. As the belt 65 is rotated, the arm 60 is guided by the guide member 66 and is moved in the forward/backward direction orthogonal to the moving direction of the horizontally moving member 42.

Provided at a bottom surface of a leading end portion of the arm 60 is a rectangular block-shaped flow path forming member 67. A cylindrical nozzle holder 68 is provided under the flow path forming member 67. The nozzle holder 68 is indicated at a front of a thick arrow in the drawing. A nozzle holder 81 for pre-treatment is provided at the leading end of the arm 60, and a pure water supply nozzle 82 and a thinner supply nozzle 83 are arranged under the nozzle holder 81 for pre-treatment in the moving direction of the horizontally moving member 42. These nozzles 82 and 83 are opened downward.

Figure 8:
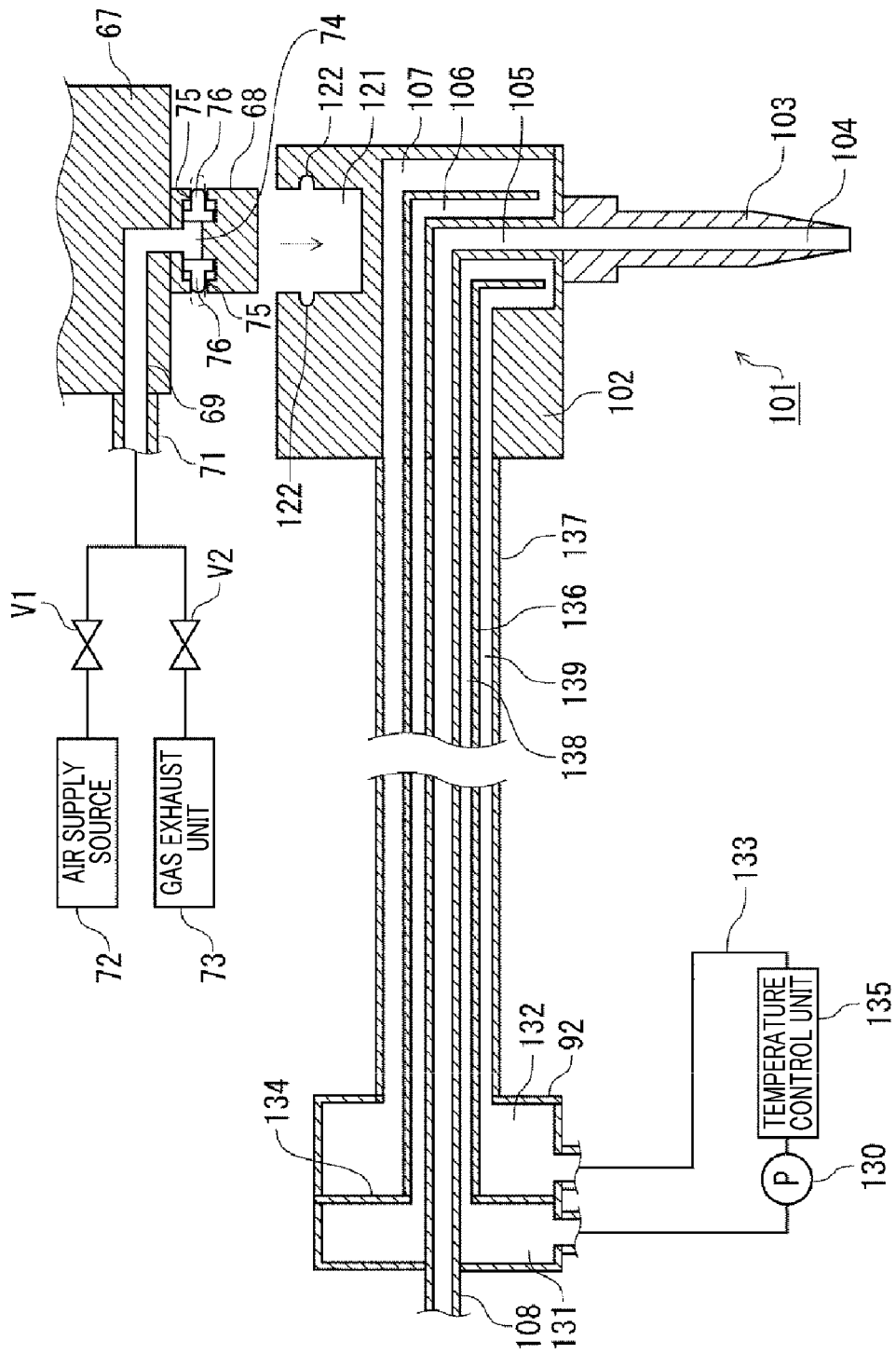
FIG. 8 is a longitudinal cross sectional view of a resist supply nozzle and a temperature-controlled water supply unit.

FIG. 8 is a longitudinal cross sectional view illustrating the flow path forming member 67 and the nozzle holder 68. An air flow path 69 is formed within the flow path forming member 67, and a pipe 71 is connected to an upstream side of the air flow path 69. An upstream side of the pipe 71 is branched, and branched lines of the pipe 71 are connected to an air supply source 72 and a gas exhaust unit 73 via valves V1 and V2, respectively. The pipe 71 is omitted in drawings other than FIG. 8 for the convenience of illustration.

The nozzle holder 68 has a hollow shape, and an inner space 74 of the nozzle holder 68 is connected with a downstream side of the air flow path 69. Holes 75 are formed in a side periphery of the nozzle holder 68. Protruding members 76 are provided in the holes 75. The protruding members 76 are protruded from and recessed into the side periphery of the nozzle holder 68 depending on an internal pressure of the inner space 74.

Referring back to FIGS. 3 and 4, a rectangular block-shaped nozzle standby section 91 and a temperature-controlled water supply port 92 are sequentially stacked on a front portion of the rotary body 31. The nozzle standby section 91 includes upwardly opened eleven holes on an upper portion thereof, and the holes are arranged in the moving direction of the horizontally moving member 42. Each hole serves as a standby region 93 of a resist supply nozzle 101 to be described later. As depicted in FIG. 4, a flow path 94 is connected to the standby region 93. A thinner supply source 87 is connected to an upstream side of the flow path 94 via a pipe 95. The pipe 95 is provided with a valve V5.

An uprightly standing cylindrical member 96 is provided under the standby region 93, and the inside of the cylindrical member 96 is connected to a waste water discharging path 97. A thinner supplied into the flow path 94 collides with an outer wall of the cylindrical member 96. Then, the thinner flows up above the cylindrical member 96 and is introduced into the resist supply nozzle 101 that is kept in a standby state within the standby region 93. Accordingly, a nozzle main body 103 of the resist supply nozzle 101 is cleaned. Further, a resist provided from the resist supply nozzle 101 during a dummy dispense operation to be described later is discharged into the cylindrical member 96 and is drained out.

The resist supply nozzle 101 will be explained with reference to FIG. 8. By way of example, eleven resist supply nozzles 101 are provided. These resist supply nozzles 101 supply different kinds of resists. Each resist supply nozzle 101 may include a rectangular supporting unit 102 and a nozzle main body 103. The nozzle main body 103 is provided under the supporting unit 102 and has an opening 104 at a lower side thereof.

The supporting unit 102 is provided with a resist flow path 105 connected to the opening 104. A temperature-controlled water supply path 106 is disposed so as to surround the resist flow path 105. Also, the temperature-controlled water supply path 106 is provided from an upstream side of the resist flow path 105 toward a downstream side thereof, and is bent at the downstream side. A bent flow path is formed at the outside of the temperature-controlled water supply path 106 so as to be extended toward an upstream side of the temperature-controlled water supply path 106, and this bent flow path is used as a temperature-controlled water discharge path 107.

The resist flow path 105 of each resist supply nozzle 101 is connected with one end of a flexible resist supply pipe 108. As depicted in FIG. 3, other end of the resist supply pipe 108 is connected with a resist supply source 109 storing therein the different kind of a resist. In FIG. 3, a reference numeral 111 denotes a resist supply system. The resist supply system 111 includes air operate valves 112 provided via the resist supply pipe 108. In response to a signal transmitted to the resist supply system 111 from a controller 151 to be described later, the air operate valves 112 are opened and closed independently. Accordingly, the resists are supplied from the respective resist supply nozzles 101 or the supplies of the resists are stopped.

Figure 9:
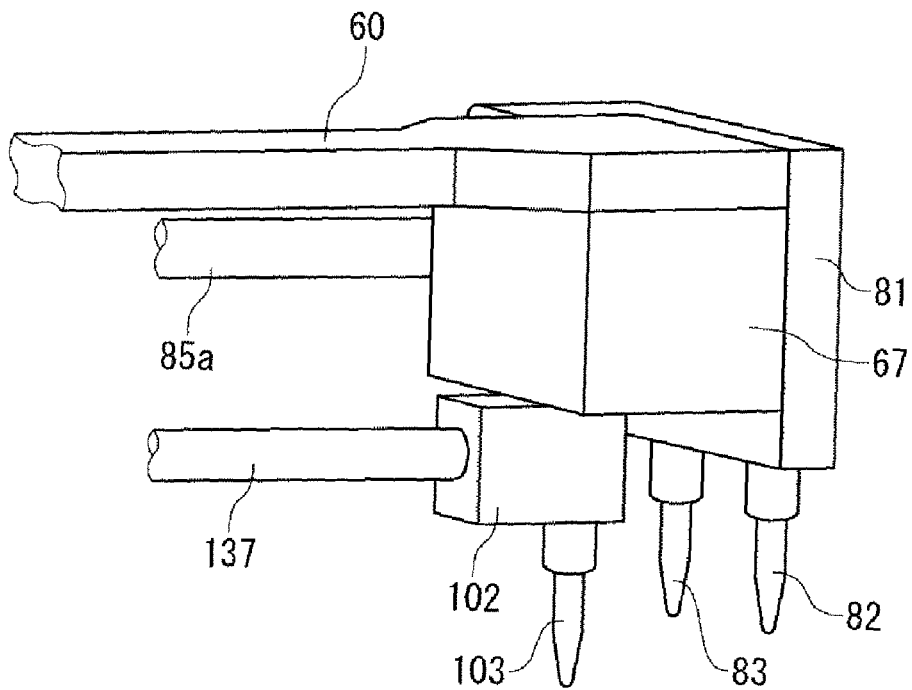
FIG. 9 is a perspective view of the resist supply nozzle.

Referring back to FIG. 8, an upwardly opened recess 121 is provided at an upper portion of the supporting unit 102, and grooves 122 are formed in a side peripheral surface of the recess 121 in a horizontal direction. The nozzle holder 68 is inserted into the recess 121 and the protrusions 76 protruded from the nozzle holder 68 are engaged with the grooves 122. Accordingly, as shown in FIG. 9, the resist supply nozzle 101 is held by the arm 60 via the nozzle holder 68.

Figure 10:
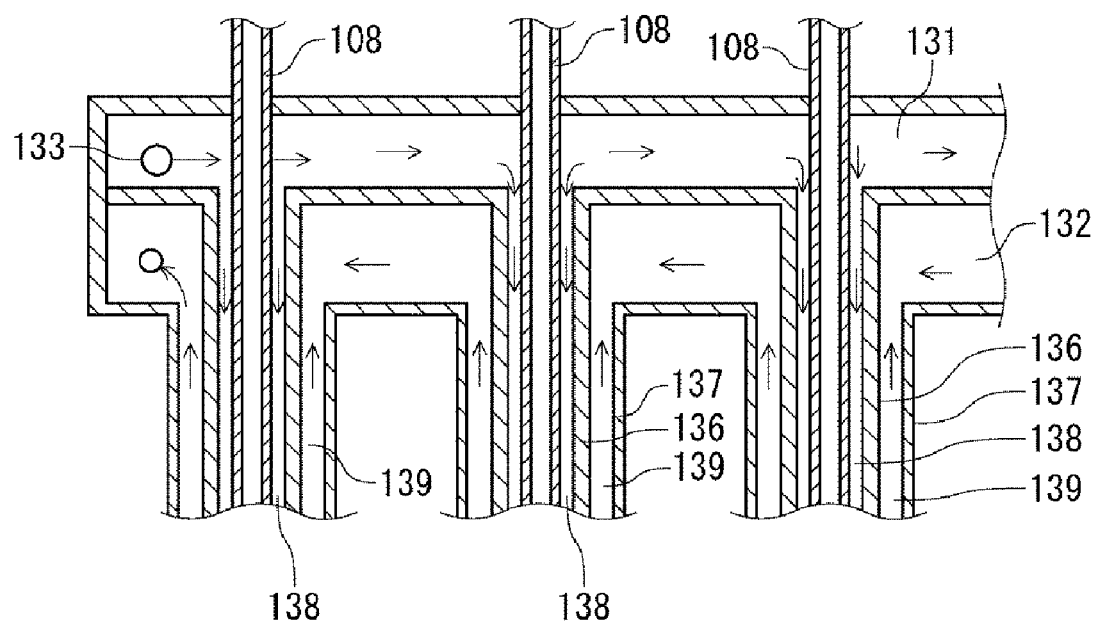
FIG. 10 is a transversal cross sectional view of the temperature-controlled water supply unit.
Figure 11:
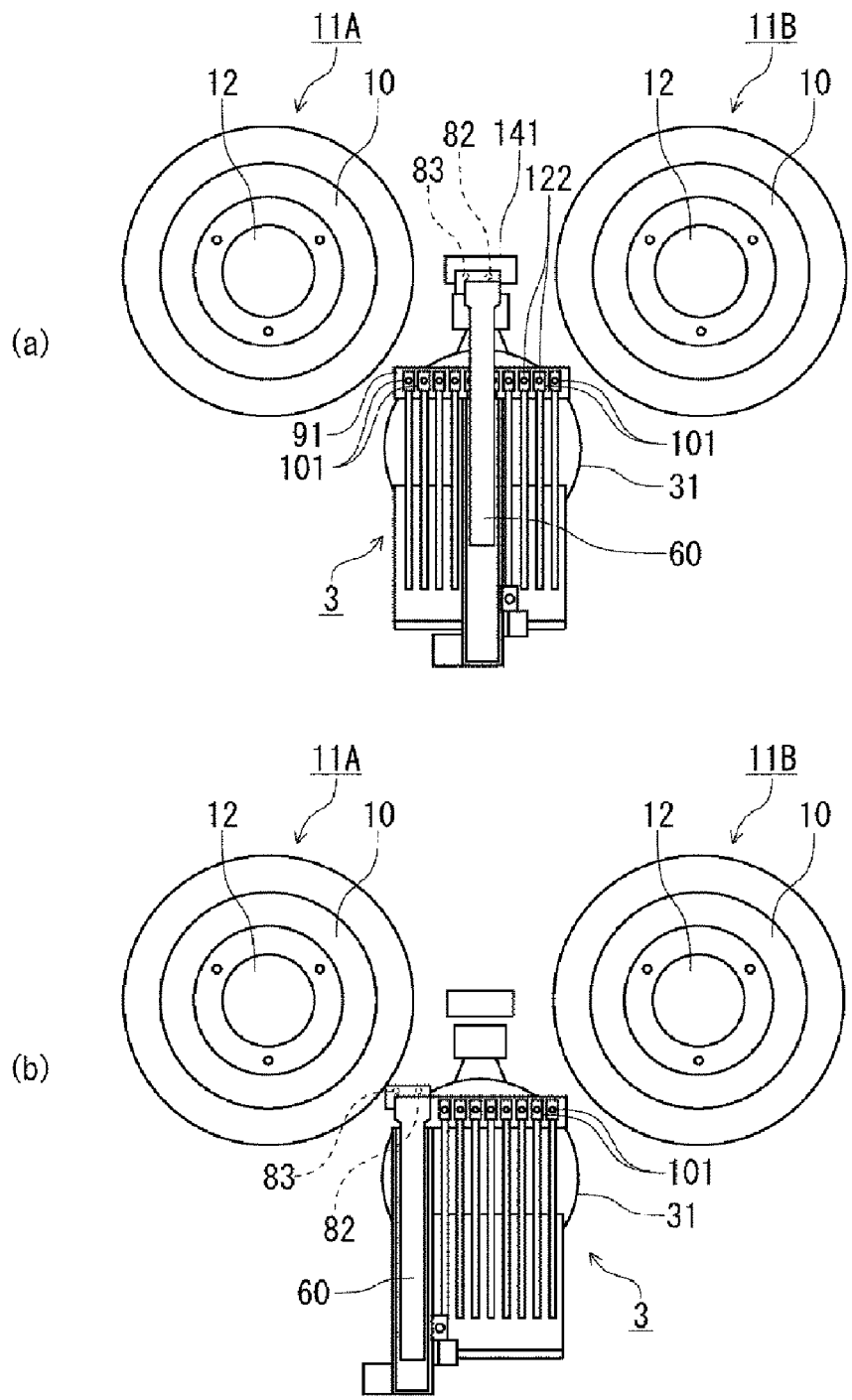
FIGS. 11(a) and 11(b) are diagrams for illustrating an operation of the resist coating apparatus.
Figure 12:
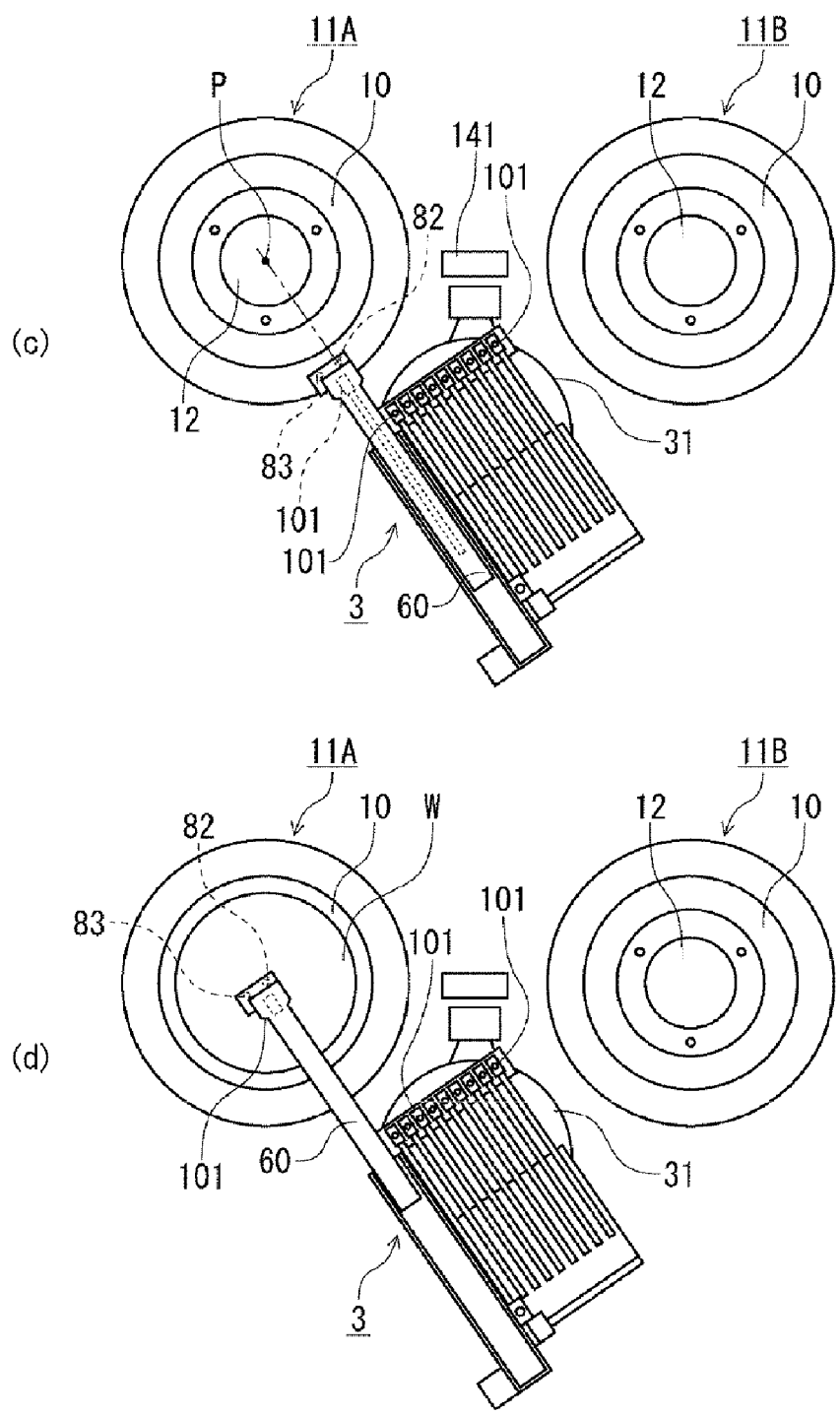
FIGS. 12(c) and 12(d) are diagrams for illustrating an operation of the resist coating apparatus.
Figure 15:
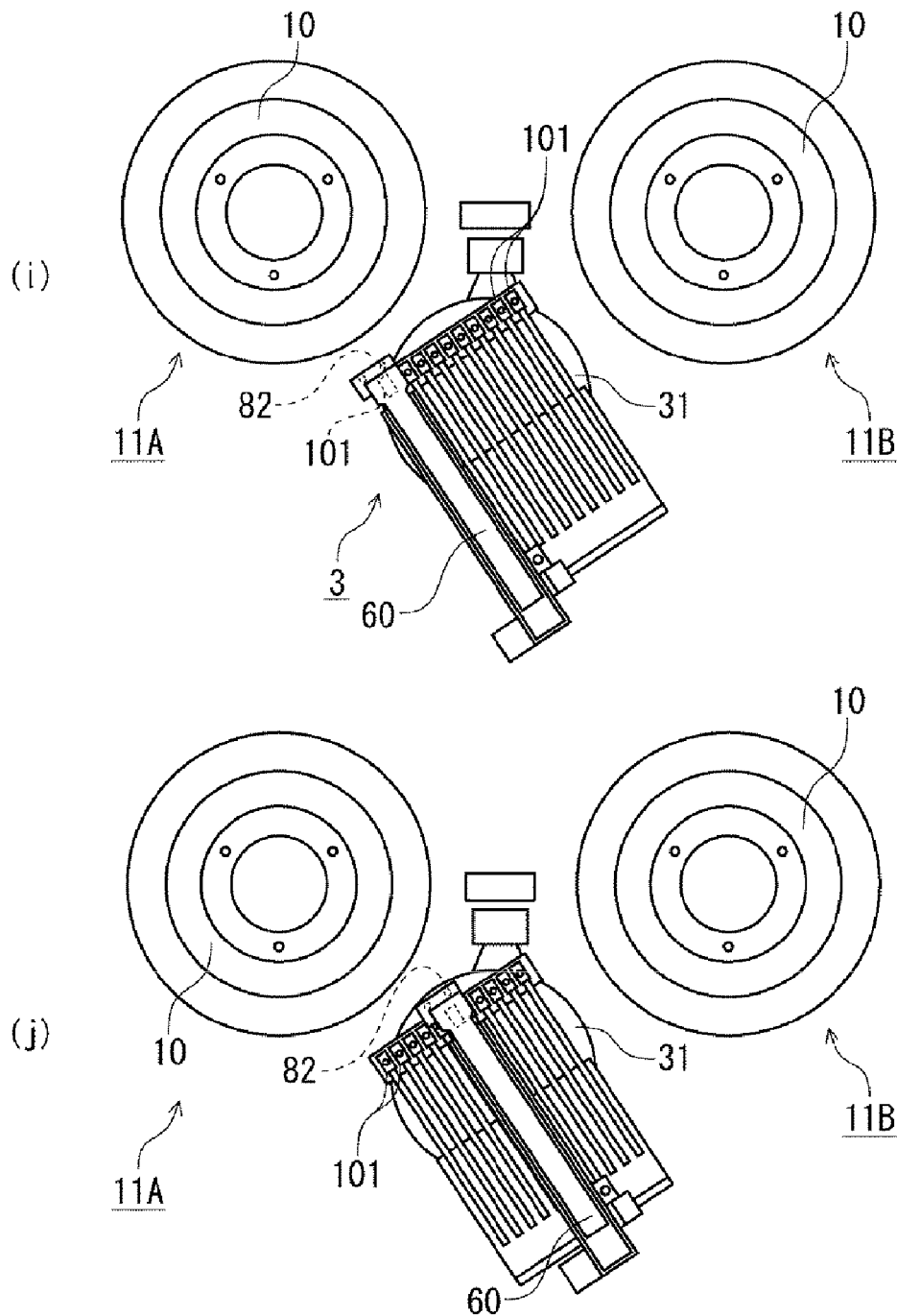
FIGS. 15(i) and 15(j) are diagrams for illustrating an operation of the resist coating apparatus.
Figure 16:
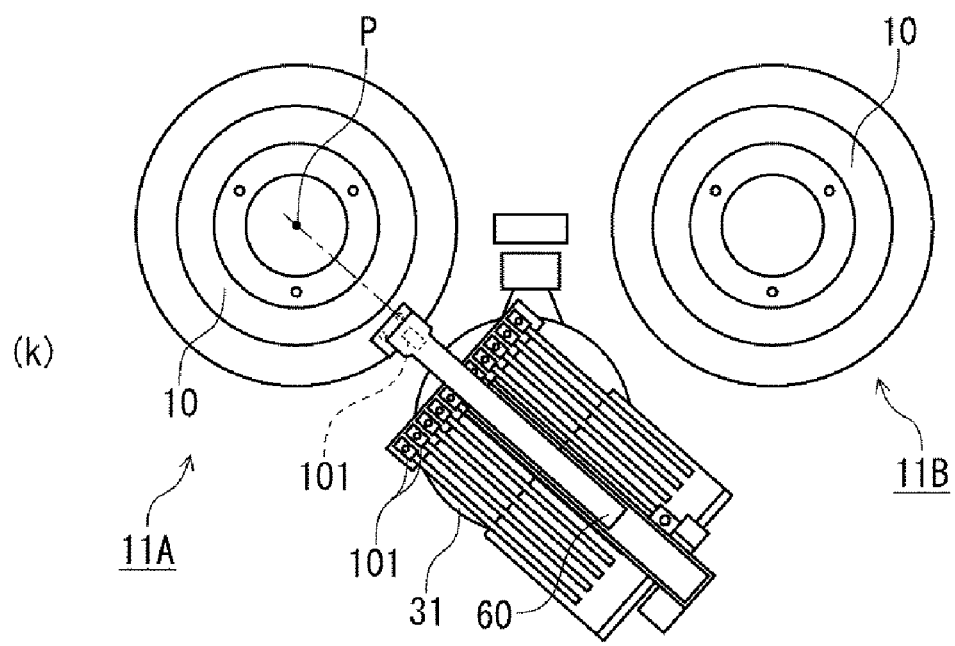
FIG. 16(k) is a diagram for illustrating an operation of the resist coating apparatus.

Now, the temperature-controlled water supply port 92 will be described with reference to FIGS. 8 and 10. FIG. 8 is a longitudinal cross sectional view of the temperature-controlled water supply port 92 and FIG. 10 is a transversal cross sectional view thereof. A supply space 131 into which temperature-controlled water is supplied and a discharge space 132 from which the temperature-controlled water is discharged are provided within the temperature-controlled water supply port 92 side by side in the forward/backward direction. The spaces 131 and 132 are divided by a partition wall 134. The resist supply pipe 108 penetrates the supply space 131 and the discharge space 132 in the forward/backward direction. The supply space 131 is connected with one end of a temperature-controlled water flow pipe 133 while the discharge space 132 is connected with the other end of the temperature-controlled water flow pipe 133. A temperature control unit 135 including a pump 130 and a heat exchanger, for example, is connected with the temperature-controlled water flow pipe 133.

Further, there are also provided a first outer pipe 136 for surrounding the resist supply pipe 108 and a second outer pipe 137 for surrounding the first outer pipe 136. The first outer pipe 136 is extended from the partition wall 134 toward the supporting unit 102 of the resist supply nozzle 101, and the second outer pipe 137 is extended from an outer wall of the temperature-controlled water supply port 92 toward the supporting unit 102. The first outer pipe 136 and the second outer pipe 137 are flexible.

A gap between the resist supply pipe 108 and the first outer pipe 136 serves as a temperature-controlled water supply path 138. A portion of the temperature-controlled water supply pipe 138 on the side of the temperature-controlled water supply port 92 is connected to the supply space 131, while a portion of the temperature-controlled water supply path 138 on the side of the resist supply nozzle 101 is connected to the temperature-controlled water supply path 106. A gap between the first and second outer pipes 136 and 137 serves as a temperature-controlled water discharge path 139. A portion of the temperature-controlled water discharge path 139 on the side of the temperature-controlled water supply port 92 is connected to the discharge space 132, while a portion of the temperature-controlled water supply path 138 on the side of the resist supply nozzle 101 is connected to the temperature-controlled water discharge path 107. That is, a temperature-controlled water circulation path is formed by the pipes, the supply path and the discharge path. Temperature-controlled water supplied from the temperature control unit 135 is circulated by the pump 130 in the order of the temperature-controlled water flow pipe 133→the supply space 131→the temperature-controlled water supply path 138→the temperature-controlled water supply path 106→the temperature-controlled water discharge path 107→the temperature-controlled water discharge path 139→the discharge space 132. Then, the temperature-controlled water from the discharge space 132 flows into the temperature-controlled water flow pipe 133, and the temperature-controlled water is controlled by the control unit 135 again. By the circulation of the temperature-controlled water, the resist flowing through the resist supply pipe 108 is controlled to have a certain temperature.

As shown in FIG. 10, a flow path of the temperature-controlled water within the temperature-controlled water supply port 92 is branched so as to correspond to the respective resist supply pipes 108. That is, the flow path of the temperature-controlled water has a manifold structure. The supply space 131 and the discharge space 132 are commonly used by the resist supply pipes 108. The temperature-controlled water supplied into the supply space 131 is introduced into the temperature-controlled water supply path 138 provided around the resist supply pipe 108. In FIG. 10, the temperature-controlled water flow path is indicated by arrows.

Though not shown, in the pure water supply nozzle 82 and the thinner supply nozzle 83, a supply path and a discharge path of the temperature-controlled water are formed outside a flow path of pure water or thinner, as the same manner in the resist supply nozzle 101. Furthermore, as illustrated in FIG. 3, a pipeline 83 connecting the pure water supply source 86 with the pure water supply nozzle 82 and a pipeline 85 connecting the thinner supply source 87 with the thinner supply nozzle 83 are formed. As in the resist supply pipe 108, a supply path of the temperature-controlled water is formed outside the pipelines 84 and 85, and a discharge path of the temperature-controlled water is formed at the outside of the supply path of the temperature-controlled water. The discharge path of the temperature-controlled water is connected to the supply path thereof. In FIG. 4, reference numerals 84a and 85a represent outer pipes located outside the pipelines 84 and 85 and serving as the discharge paths of the temperature-controlled water, respectively. A reference numeral 86a denotes a connecting portion between the outer pipes 84a and 85a. Further, V3 and V4 represent valves provided on the pipelines 84 and 85. Further, in the drawings other than FIG. 3, upstream sides of the pipelines 84 and 85 are not illustrated.

As depicted in FIGS. 1 and 4, a dummy dispense unit 141 is positioned between the two cups 15. The dummy dispense unit 141 is formed in a vessel shape having an open top, and an inside of the dummy dispense unit 141 serves as a dummy dispense region 142. The dummy dispense unit 141 may be used to perform a dummy dispense operation regularly by locating the pure water supply nozzle 82 and the thinner supply nozzle 83 above the dummy dispense unit 141 when the resist coating apparatus 1 is kept in a standby state without performing any process on the wafer W. A liquid drain pipe 143 is connected to the dummy dispense region 142 and processing solutions discharged from the pure water supply nozzle 82 and the thinner supply nozzle 83 are drained through the liquid drain pipe 143.

The resist coating apparatus 1 includes the controller 151 implemented by, e.g., a computer. The controller 151 may include a program, a memory, a data processing unit having a CPU, or the like. The program stores therein commands (processing steps) for performing processes to be described later by sending a control signal from the controller 151 to each component of the resist coating apparatus 1, and by controlling operations of the motors, opening/closing operations of the valves and elevation of the elevation pins, and so forth. The program (including a program related to input, manipulation or display of processing parameters) is stored in a computer-readable storage medium such as a flexible disk, a compact disk, a hard disk, or a MO (Magneto Optical) disk and is installed in the controller 151.

In the memory, a lot ID of the wafer W, a nozzle to be used for a pre-treatment (pre-wetting) for improving wettability of a resist and a resist supply nozzle 101 to be used are stored in correspondence to each other. Further, for each resist supply nozzle 101, a time taken until a dummy dispense operation is performed and a time taken until a cleaning process is performed are also stored in the memory. The dummy dispense operation refers to an operation for discharging a resist when the resist supply nozzle 101 is in a standby state in the nozzle standby section 91 and for removing resist remaining within the resist supply nozzle 101 or the resist supply pipe 108. Further, the cleaning process refers to an operation for cleaning the resist supply nozzle 101 in the standby region 93 when the resist supply nozzle 101 is in a standby state in the nozzle standby section 91.

Figure 17:
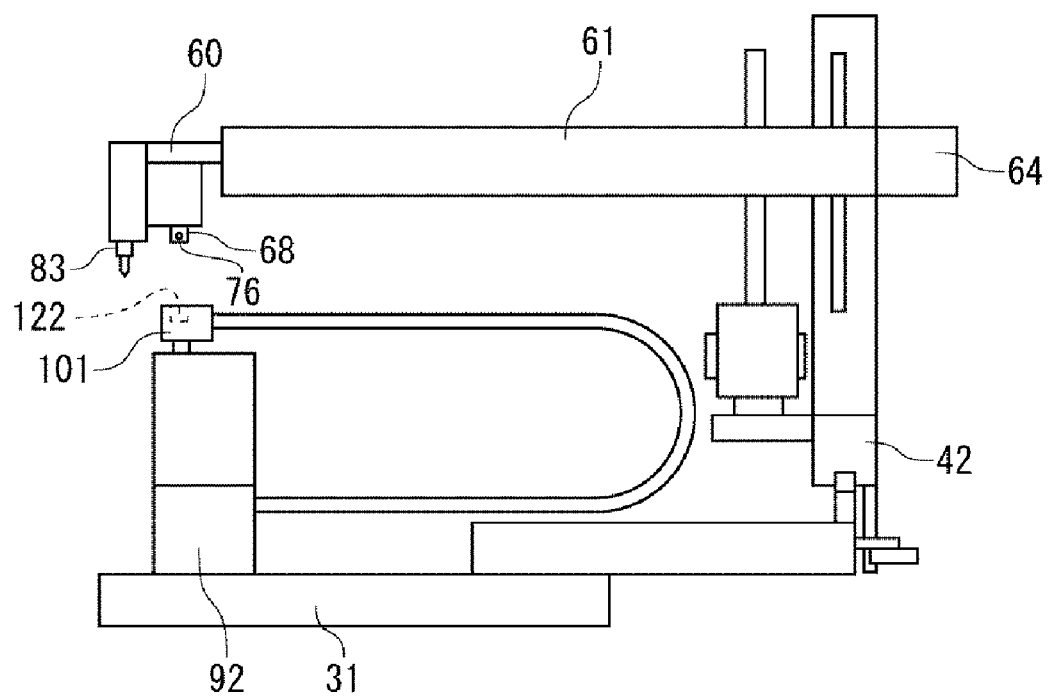
FIG. 17 is an explanatory diagram for illustrating a state in which a resist supply nozzle is transferred.
Figure 18:
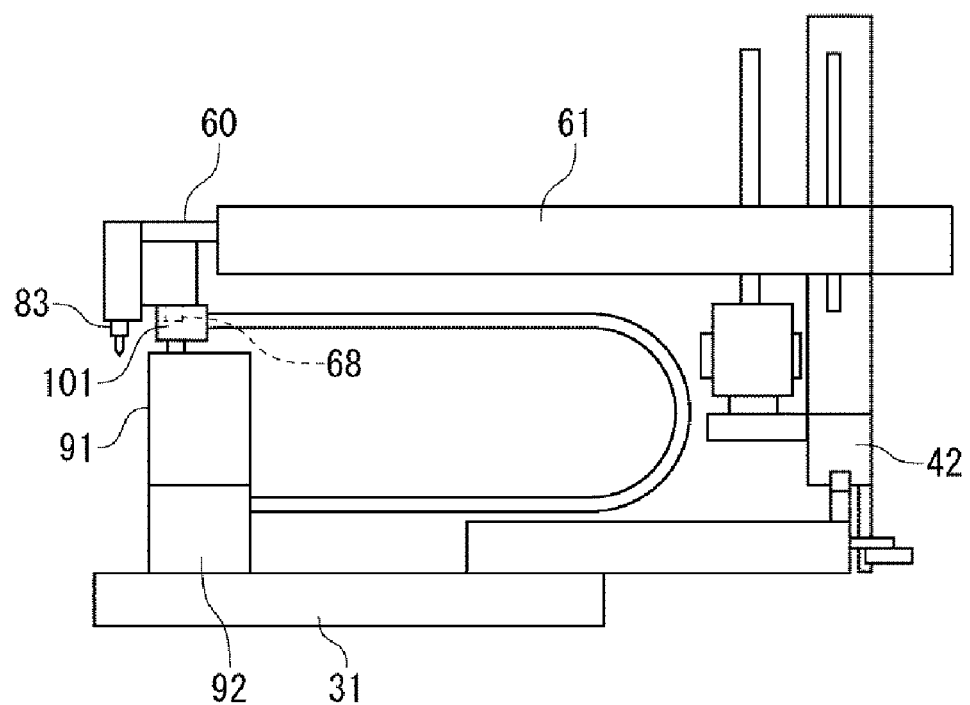
FIG. 18 is an explanatory diagram for illustrating a state in which the resist supply nozzle is transferred.
Figure 19:
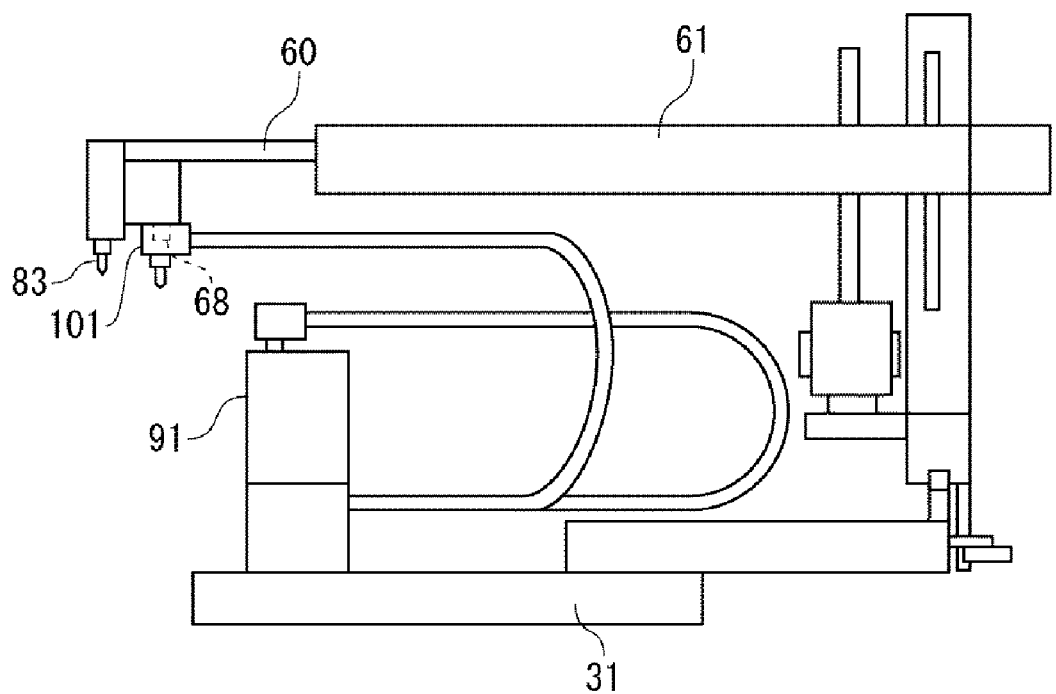
FIG. 19 is an explanatory diagram for illustrating a state in which the resist supply nozzle is transferred.

Now, processes for coating a resist on a wafer W by the resist coating apparatus 1 will be explained with reference to FIG. 11(a) to FIG. 16(k) and, also, with reference to FIGS. 17 to 19 illustrating the side surface of the arm 60, when necessary. In this embodiment, wafers W are alternately transferred by the substrate transfer device into the coating processing units 11A and 11B in this sequence. Further, in this embodiment, a pre-wetting operation is performed on the wafer W by the pure water supply nozzle 82. Prior to processing a first wafer of a lot, a dummy dispense operation is performed to the pure water supply nozzle 82 by the dummy dispensing unit 141 (FIG. 11(a)). Then, an operation for processing the wafer W is started.

The arm 60 is moved upwardly, backwardly and horizontally so that, as illustrated in FIG. 17, the nozzle holder 68 is located above the resist supply nozzle 101 for processing a wafer W to be transferred into the coating processing unit 11A (FIG. 11(b)). Then, the arm 60 is moved downwardly, and the nozzle holder 68 is inserted into the recess 121 of the resist supply nozzle 101. Thereafter, the protruding members 76 are engaged with the grooves 122 formed in the recess 121. Accordingly, the resist supply nozzle 101 is held by the nozzle holder 68.

Then, the arm 60 is moved upwardly while holding the resist supply nozzle 101, and the rotary body 31 is rotated so that the leading end of the arm 60 is oriented toward the coating processing unit 11A. While the arm 60 is being moved upwardly and the rotary body 31 is being rotated, the horizontal moving member 42 does not move the arm 60 in a horizontal direction. If the arm 60 is oriented toward the coating processing unit 11A, the arm 60 is moved forward, as illustrated in FIG. 19, and is stopped (FIG. 12(c)). Therefore, the leading end of the arm 60 is located above an outer periphery of the opening 10 of the cup 15 in the coating processing unit 11A. At this time, the arm 60 is positioned such that a center P of the spin chuck 12 is deviated, in a forward/backward direction of the arm 60, from an axis of the pure water supply nozzle 82 for performing a pre-wetting operation. This position will be referred to as a "process preparation position" of the arm 60 for the simplicity of explanation.

The wafer W is transferred into the coating processing unit 11A by the substrate transfer device 20. Then, by the cooperation between the substrate transfer device 20 and the elevation pins 23, the wafer W is transferred onto the spin chuck 12 so as to be located coaxially with respect to the spin chuck 12. Thereafter, the arm 60 is moved forward and the pure water supply nozzle 82 is located above the center of the wafer W (FIG. 12(d)). The wafer W is rotated about a vertical axis and pure water is supplied to the center of the wafer W from the pure water supply nozzle 82. The supplied pure water diffuses to the periphery of the wafer W, so that wettability of a resist at the surface of the wafer W is improved.

If the supply of the pure water is stopped, the rotary body 31 is rotated. Then, the arm 60 is moved forward, and the resist supply nozzle 101 held by the arm 60 is located above the center of the wafer W (FIG. 13(e)). Thereafter, a resist is supplied to the center of the wafer W from the resist supply nozzle 101. The supplied resist is diffused to the periphery of the wafer W, so that the resist is coated on the entire surface of the wafer W.

If the supply of the resist is stopped, the arm 60 is moved backwardly so that the leading end of the arm 60 is taken out of the cup 15 (FIG. 13(f)). Subsequently, the rotary body 31 is rotated so as to allow the leading end of the arm 60 to be oriented toward the coating processing unit 11B. Then, the arm 60 is stopped if the leading end of the arm 60 is located at a process preparation position at an outer periphery of an opening 10 of the cup 15 in the coating processing unit 11B (FIG. 14(g)). As in the case of performing the process in the coating processing unit 11A, the arm 60 is positioned such that the center P of the spin chuck 12 is deviated, in the forward/backward direction of the arm 60, from the axis of the pure water supply nozzle 82 for performing the pre-wetting operation.

Thereafter, as in the case of performing the process in the coating processing unit 11A, if a wafer W is loaded into the coating processing unit 11B, the arm 60 is moved forward (FIG. 14(h)), and a pre-wetting process and a resist coating process are performed on the wafer W in sequence. While the pre-setting process and the resist coating process are being performed in the coating processing unit 11B, in the coating processing unit 11A, the rotation of the wafer W is stopped and the wafer W is unloaded from the cup 15 by the substrate transfer device 20 and the elevation pins 23, in sequence.

In this way, the processes are repetitively performed on wafers W in the coating processing units 11A and 11B. After a last wafer W of the lot is processed, the arm 60 is further retreated from above the outer periphery of the cup 15. If the nozzle holder 68 at the leading end of the arm is positioned above the nozzle standby section 91, the retreating movement of the arm 60 is stopped (FIG. 15(i)). Then, if the arm 60 is lowered and the resist supply nozzle 101 held by the arm 60 is returned back into the nozzle standby section 91, the resist supply nozzle 101 is released from the nozzle holder 68. Thereafter, the arm 60 is moved upwardly, and then, is moved horizontally. If the nozzle holder 81 is located above a resist supply nozzle 101 for processing a next lot, the horizontal movement of the arm 60 is stopped (FIG. 15(j)). Subsequently, the arm 60 is lowered and the resist supply nozzle 101 is held by the arm 60 in the same manner as described above. Then, the arm 60 is moved to a process preparation position as in the case of processing the previous lot, and the process is performed continuously (FIG. 16(k)).

Figure 20:
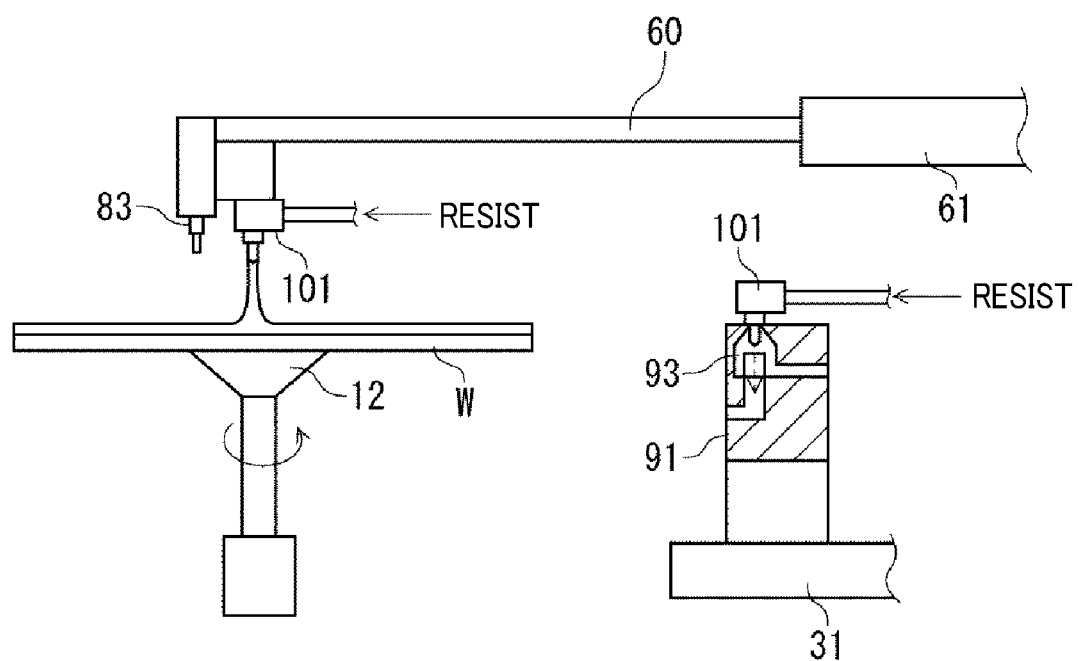
FIG. 20 is an explanatory diagram for illustrating a state in which maintenance is performed.
Figure 21:
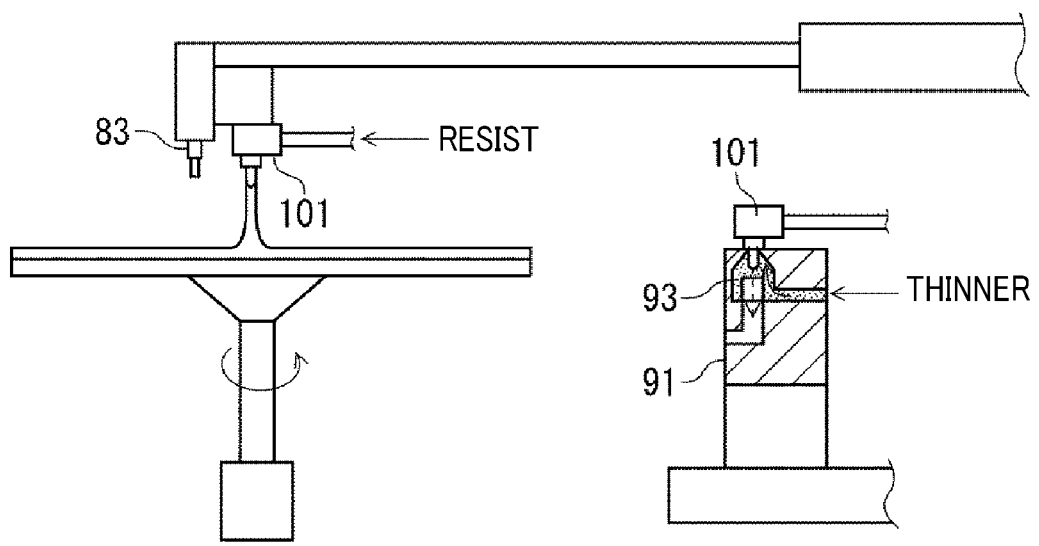
FIG. 21 is an explanatory diagram for illustrating a state in which maintenance is performed.

During the wafer process, whenever a preset time elapses for each resist supply nozzle, a dummy dispense operation where the resist is discharged from the resist supply nozzle 101 is performed in the nozzle standby section 91. FIG. 20 illustrates a state in which the dummy dispense operation is performed. Further, like the dummy dispense operation, a cleaning process is also performed whenever a predetermined time elapses. FIG. 21 illustrates a state in which thinner is supplied into the standby region 93 and the resist supply nozzle 101 is cleaned. When the resist supply nozzle 101 is held by the arm 60, if it is a time for performing the dummy dispense operation or the cleaning process (for example, if the process on the lot currently being processed is completed and the resist supply nozzle 101 is returned back into the nozzle standby section 91), the dummy dispense operation or the cleaning process is performed.

In accordance with the resist coating apparatus 1 described above, the resist supply nozzle 101 is held by the arm 60 and the process is performed on the wafer W. While performing the process on the wafer W, maintenance such as the dummy dispense operation or the cleaning process can be performed for the resist supply nozzle 101 in a standby state in the nozzle standby section 91. Accordingly, it is possible to suppress the throughput reduction due to the maintenance of the resist coating apparatus 1. Moreover, it is also possible to replace a resist stored in the resist supply source 109, provided at the upstream of the resist supply nozzle 101 in the standby state in the nozzle standby section 91, with another kind of resist while performing the process on the wafer W. In addition, it is also possible to remove the resist remaining within the resist supply nozzle 101 and the resist supply pipe 108 by continuously discharging the resist from the resist supply nozzle 101. In this way, the throughput reduction can also be suppressed when the resist is replaced.

In addition, in the resist coating apparatus 1, as the rotary body 31 is rotated, the arm 60 is oriented toward the coating processing units 11A or 11B, and the nozzle standby section 91 provided in the rotary body 31 is moved. Accordingly, the arm 60 lifts and holds the resist supply nozzle 101 from the nozzle standby section 91, and moves to a processing position in the coating processing unit 11A or 11B. Thus, since it is not necessary to provide a guide over the coating processing units 11A and 11B so as to allow the arm 60 and the nozzle standby section 91 to be located above the coating processing units 11A and 11B, it is possible to suppress an increase of an installation space for the resist coating apparatus 1.

Moreover, since the two cups are arranged and the resist supply nozzle 101 is moved between the two cups, there is no possibility for the resist supply nozzle 101 to move across the wafer W on which a drying process, for example, is performed after the resist is coated. Accordingly, processing solutions do not drop on the wafer W currently being processed from the resist supply nozzle 101, the pure water supply nozzle 82 and the thinner supply nozzle 83. Thus, it is possible to suppress a production yield reduction.

In addition, in the present embodiment, until the wafer W is loaded into the cup 15, the leading end of the arm 60 is stopped at the outer periphery of the opening 10 of the cup 15, and a discharging position of the pure water discharged from the pure water supply nozzle 82 is deviated from the center of the spin chuck 12 in the forward direction. If the wafer W is loaded into the cup 15, the arm 60 is moved forward and the pre-wetting process is performed. Accordingly, the processing of the wafer W can be started promptly, and, thus, throughput can be improved. When the pre-wetting process is not performed, the resist supply nozzle 101 instead of the pure water supply nozzle 82 may be kept in a standby state at the same position. Therefore, it is possible to start the processing of the wafer W promptly. Moreover, in the above-described embodiment, the arm 60 is not moved in the arrangement direction of the resist supply nozzles 101 when the arm 60 is moved forwardly and backwardly with respect to the coating processing units 11A and 11B. Therefore, it can be prevented that the second outer pipe 137 connected with the resist supply nozzle 101 held by the arm 60 is moved inclined with respect to an extending direction of the second outer pipe 137. Accordingly, it can be prevented that the second outer pipe 137 becomes defective or particles thereof are generated by the friction between the second outer pipe 137 connected with the resist supply nozzle 101 held by the arm 60 and another second outer pipe 137 or a structure of the resist coating apparatus 1.

Moreover, in the above-described embodiment, although the different kinds of resists having different compounds are supplied from the resist supply nozzles 101, it may be also possible to supply a resist having the same compounds at different temperatures. The "different kinds of resists" supplied from the respective processing nozzles includes not only a case where the kinds of liquids are different but also a case where the kind of a liquid is same but temperatures of the liquid are different.

Further, although the above embodiment has been described for the resist supplying apparatus, the present disclosure is also applicable to an apparatus and a method for performing a liquid process by supplying a multiple number of processing solutions to two cups from respective nozzles. To be specific, the present disclosure can be applied to a substrate surface processing apparatus and a substrate surface processing method for performing a cleaning process, an etching process or the like.

Figure 22:
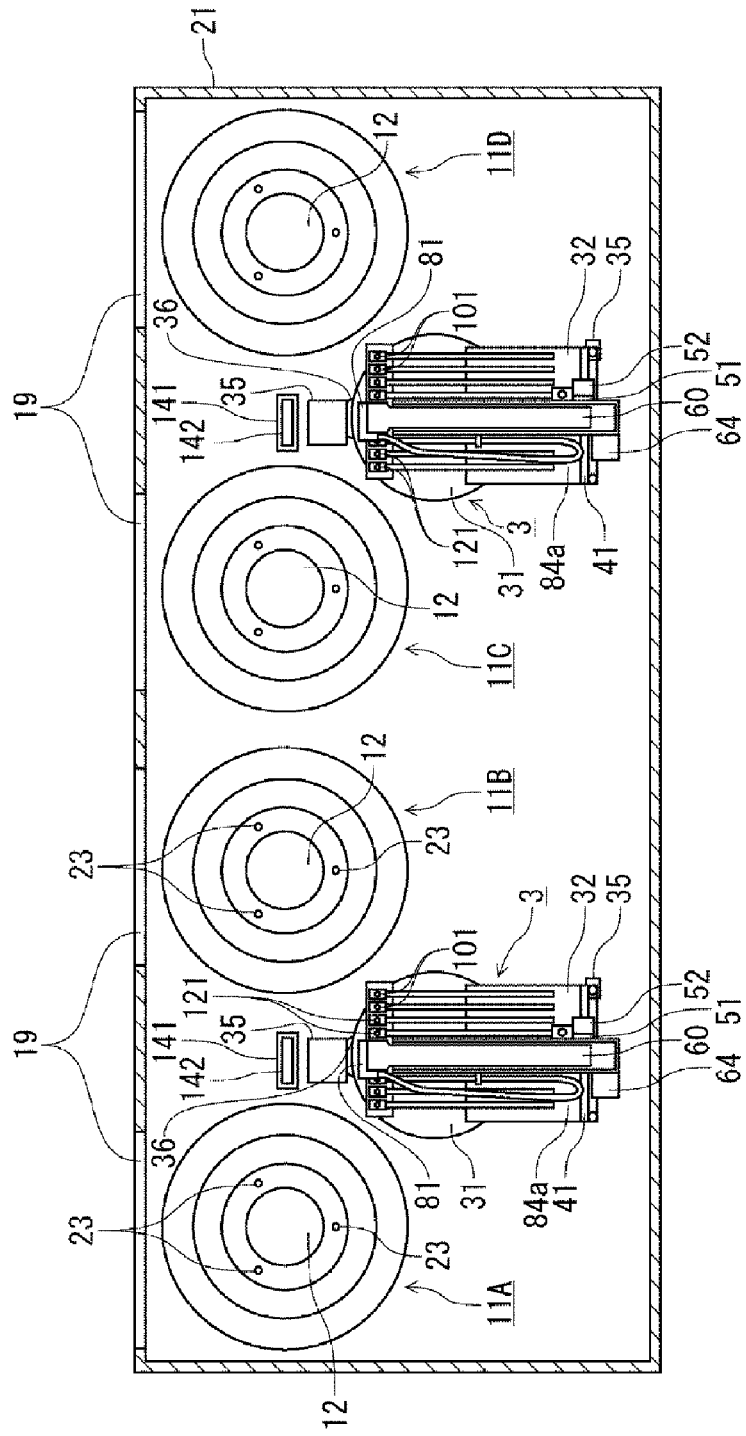
FIG. 22 is a plane view of a resist coating apparatus in accordance with another embodiment of the present disclosure.

Furthermore, in the above-described embodiment, although the two coating processing units 11A and 11B and the single resist supply unit 3 are provided within the single housing 21, the present disclosure may be configured as illustrated in FIG. 22, for example. In this example, coating processing units 11C and 11D having the same configurations as those of the coating processing units 11A and 11B are additionally provided in the housing 21. The coating processing units 11A to 11D are arranged in a single straight line. Further, two resist supply units 3 are provided. A rotary body 31 of one resist supply unit 3 is equi-distanced from the coating processing units 11A and 11B while a rotary body 31 of the other resist supply unit 3 is equi-distanced from the coating processing units 11C and 11D. By way of example, as compared to a configuration in which a resist supply nozzle 101 commonly used for the coating processing units 11A to 11D passes above the respective coating processing units 11A to 11D, it does not happen in this resist coating apparatus that the resist supply nozzle 101 is moved to another cup over a cup in which the wafer W is currently being processed. Thus, it is possible to suppress a production yield reduction that might be caused as the resist drops onto the wafer W currently being processed.

Figure 23:
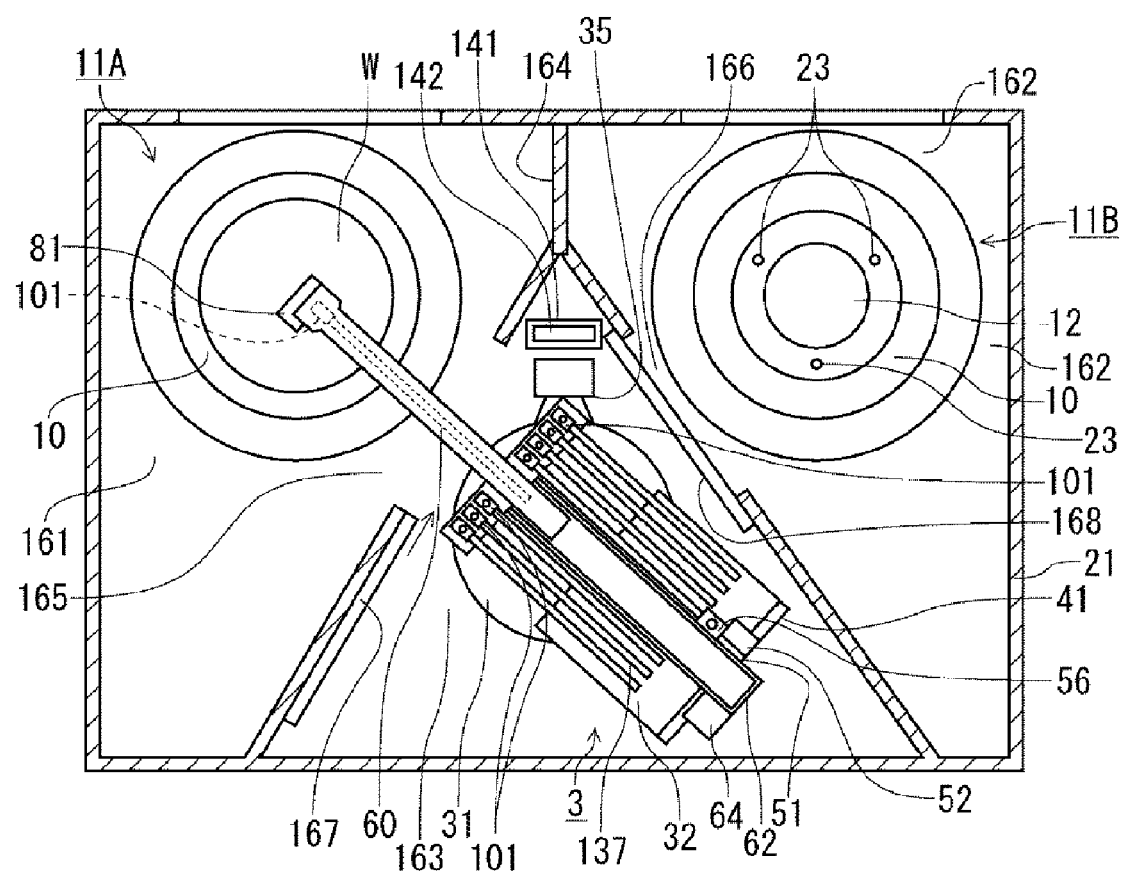
FIG. 23 is a plane view of a resist coating apparatus in accordance with still another embodiment of the present disclosure.

FIG. 23 illustrates another example resist coating apparatus. In this resist coating apparatus, a space 161 around a coating processing unit 11A, a space 162 around a coating processing unit 11B and a space 163 around a resist supply unit 3 are separated from each other by partition walls 164. An opening 165 is provided between the spaces 161 and 163, and an opening 166 is provided between the spaces 162 and 163. Shutters 167 and 168 capable of opening and closing the openings 165 and 166 are provided at the openings 165 and 166, respectively. When a process is performed on a wafer W in the coating processing unit 11A, the shutter 167 of the opening 165 is opened and an arm 60 enters into the space 161. Further, when a process is performed on a wafer W in the coating processing unit 11B, the shutter 168 of the opening 166 is opened and the arm 60 enters into the space 162.

In this way, except when the processes in the coating processing units 11A and 11B are performed, the shutters 167 and 168 are closed. Accordingly, it is possible to prevent that an atmosphere in one of the coating processing units 11A and 11B is introduced into an atmosphere in the other. This configuration may be especially effective in case where a process in one coating processing unit may be adversely affected if an atmosphere in a cup of the other coating processing unit is introduced into an atmosphere in a cup of the one coating processing unit. By way of example, in case where different kinds of resists are used in the coating processing units 11A and 11B and components of the resists are changed by a chemical reaction therebetween, the configuration shown in FIG. 23 may be used and a production yield reduction can be more securely suppressed.

In the above-described embodiment, although the pre-wetting process is performed by the pure water, it may be also possible to use a thinner. In case of using the thinner, the thinner may be supplied to the center of the wafer W as in the case of using the pure water. Furthermore, it may be also possible to use a mixture of a thinner and the pure water as a processing solution for the pre-wetting process. In such a case, the mixture instead of the thinner or the pure water may be stored in the processing solution supply sources 86 and 87 for pre-wetting and can be supplied to the wafer W from the nozzles 82 and 83. Furthermore, it may be also possible to discharge one of the thinner and the pure water from a nozzle and discharge the other from the same nozzle. Moreover, the nozzles 82 and 83 can be fastened to the nozzle holder 81 so as to supply the thinner and the pure water to the center of the wafer W at the same time, thus making it possible to supply the mixture of the thinner and the pure water to the center of the wafer W.

Figure 24:
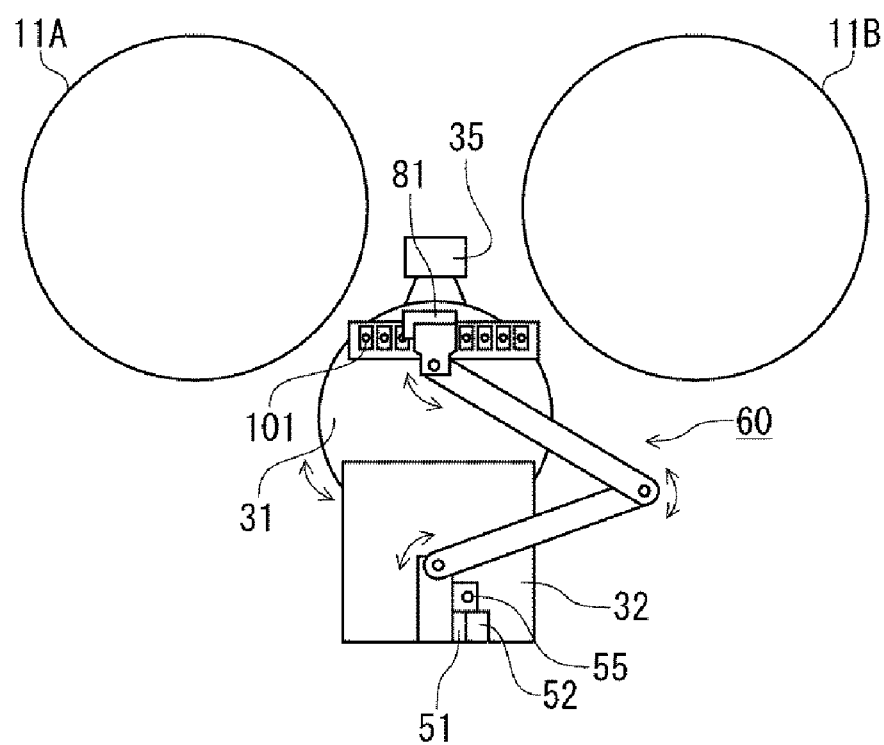
FIG. 24 is a schematic plane view of a resist coating apparatus in accordance with still another embodiment of the present disclosure.

The arm 60 may be a multi-joint arm as illustrated in FIG. 24. In this example, as in the above-described embodiment, the arm 60 may be guided by each guide member and moved horizontally in the arrangement direction of the resist supply nozzles 101 and moved forward from a position facing each cup 15. Accordingly, manufacturing cost of the apparatus can be reduced.

Figure 25:
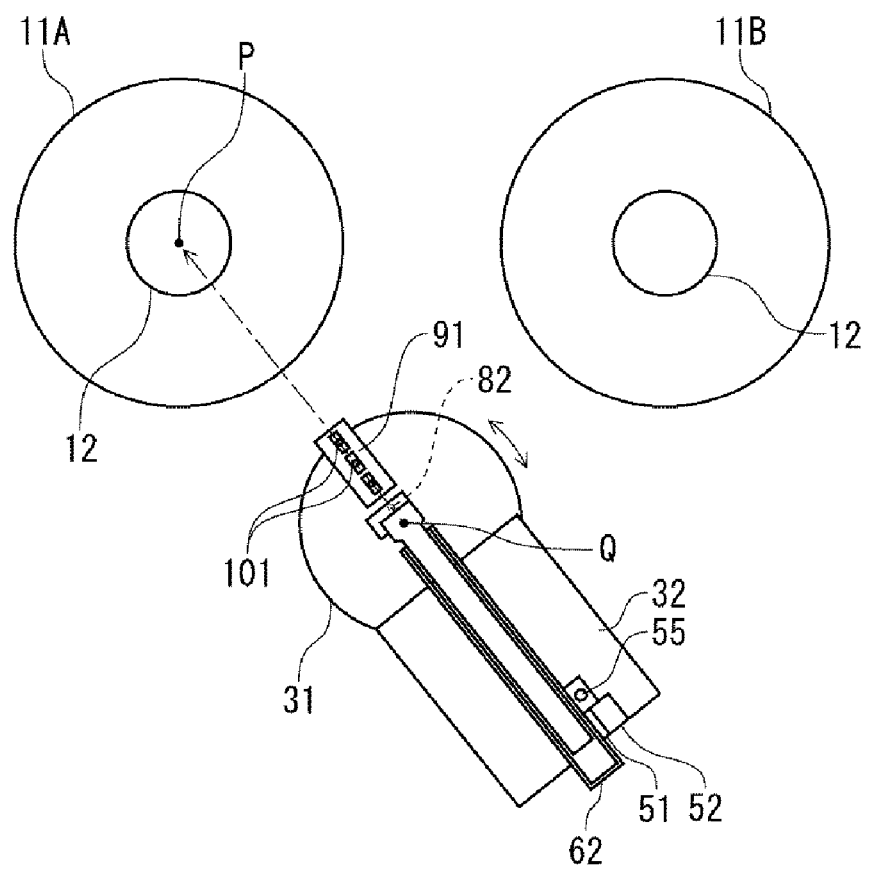
FIG. 25 is a schematic plane view of a resist coating apparatus in accordance with still another embodiment of the present disclosure.

Moreover, as illustrated in FIG. 25, resist supply nozzles 101 may be arranged in the forward direction of the arm 60. The resist supply nozzles 101 are arranged on a line connecting the center P of the spin chuck 12 and a rotation center O of the rotary body. Further, the pure water supply nozzle 82 for pre-wetting is also provided on this line. In such a configuration, only by moving the arm up and down, and in the forward direction, the resist supply nozzle 101 can be moved to above a wafer W and a process can be performed on the wafer W. Accordingly, a horizontally moving unit need not be provided at the arm 60, and thus, manufacturing cost can be reduced.

What is claimed is:

1. A liquid processing apparatus comprising:
   a first processing region and a second processing region arranged in a left-right direction, each for accommodating therein a substrate horizontally and performing therein a process on the substrate by a processing solution from a nozzle;
   a rotary body positioned at a rear side of an arrangement of the first and the second processing regions, and configured to be rotatable about a vertical axis;
   a plurality of processing nozzles provided on the rotary body such that the plurality of processing nozzles rotate with the rotary body while kept in a standby state at an outside of the first processing region and the second processing region, commonly used for the first processing region and the second processing region, and configured to supply different kinds of processing solutions to the substrate, respectively;
   a nozzle transfer device, having a nozzle holder capable of being moved back and forth, provided on the rotary body such that the nozzle transfer device rotates with the rotary body and the plurality of processing nozzles and configured to transfer a processing nozzle selected from the plurality of processing nozzles into a selected one of the first and the second processing regions while holding the selected processing nozzle by the nozzle holder; and
   a rotation driving unit configured to rotate the rotary body so as to allow a front of the nozzle holder in a forward/backward direction thereof to face the selected one of the first and the second processing regions.

2. The liquid processing apparatus of claim 1, wherein a distance from a center of a substrate holding area in the first processing region to a rotation center of the rotary body is the same as a distance from a center of a substrate holding area in the second processing region to the rotation center of the rotary body.

3. The liquid processing apparatus of claim 2, wherein the rotary body includes a standby section in which the plurality of processing nozzles is kept in a standby state.

4. The liquid processing apparatus of claim 2, further comprising a controller for controlling an operation of the nozzle holder,
   wherein each of the first processing region and the second processing region is provided in a cup having a top opening, and
   the controller performs:
   moving the nozzle holder holding the processing nozzle to an outer periphery of the top opening of the cup until the substrate is transferred into the cup and stopping the nozzle holder at the outer periphery of the top opening of the cup; and moving the nozzle holder to above the substrate after the substrate is transferred into the cup.

5. The liquid processing apparatus of claim 2, wherein the plurality of processing nozzles are arranged in a direction orthogonal to the forward/backward direction of the nozzle holder, and the nozzle holder is capable of moving in an arrangement direction of the plurality of processing nozzles so as to be located to a position corresponding to the selected processing nozzle.

6. The liquid processing apparatus of claim 1, wherein the rotary body includes a standby section in which the plurality of processing nozzles is kept in a standby state.

7. The liquid processing apparatus of claim 6, further comprising a controller for controlling an operation of the nozzle holder, wherein each of the first processing region and the second processing region is provided in a cup having a top opening, and the controller performs:

moving the nozzle holder holding the processing nozzle to an outer periphery of the top opening of the cup until the substrate is transferred into the cup and stopping the nozzle holder at the outer periphery of the top opening of the cup; and moving the nozzle holder to above the substrate after the substrate is transferred into the cup.

8. The liquid processing apparatus of claim 6, wherein the plurality of processing nozzles are arranged in a direction orthogonal to the forward/backward direction of the nozzle holder, and the nozzle holder is capable of moving in an arrangement direction of the plurality of processing nozzles so as to be located to a position corresponding to the selected processing nozzle.

9. The liquid processing apparatus of claim 1, further comprising a controller for controlling an operation of the nozzle holder, wherein each of the first processing region and the second processing region is provided in a cup having a top opening, and the controller performs:

moving the nozzle holder holding the processing nozzle to an outer periphery of the top opening of the cup until the substrate is transferred into the cup and stopping the nozzle holder at the outer periphery of the top opening of the cup; and moving the nozzle holder to above the substrate after the substrate is transferred into the cup.

10. The liquid processing apparatus of claim 9, wherein the plurality of processing nozzles are arranged in a direction orthogonal to the forward/backward direction of the nozzle holder, and the nozzle holder is capable of moving in an arrangement direction of the plurality of processing nozzles so as to be located to a position corresponding to the selected processing nozzle.

11. The liquid processing apparatus of claim 1, wherein the plurality of processing nozzles are arranged in a direction orthogonal to the forward/backward direction of the nozzle holder, and the nozzle holder is capable of moving in an arrangement direction of the plurality of processing nozzles so as to be located to a position corresponding to the selected processing nozzle.

12. The liquid processing apparatus of claim 11, further comprising a controller for controlling operations of the nozzle holder and the rotary body, wherein the controller performs:

moving the nozzle holder in the arrangement direction of the plurality of processing nozzles and holding the processing nozzle by the nozzle holder;

rotating the rotary body so as to allow the front of the nozzle holder holding the processing nozzle in the forward/backward direction to face the first processing region or the second processing region; and moving the nozzle holder into the first processing region or the second processing region.

13. The liquid processing apparatus of claim 1, wherein at least one hole is formed at a side periphery of the nozzle holder, and at least one protruding member is provided in the at least one hole, and the at least one protruding member is configured to be protruded from the side periphery of the nozzle holder by adjusting an internal pressure of an inner space of the nozzle holder, and wherein each of the plurality of processing nozzles includes a supporting unit and a nozzle main body, an upwardly opened recess is provided at an upper portion of the supporting unit, and at least one groove is formed at an inner side surface of said recess, and the nozzle holder is configured to be inserted into said recess, and the at least one protruding member protruded from the nozzle holder is configured to be engaged with the at least one groove.

* * * * *